US006869216B1

(12) United States Patent
Holloway et al.

(10) Patent No.: US 6,869,216 B1
(45) Date of Patent: Mar. 22, 2005

(54) DIGITIZING TEMPERATURE MEASUREMENT SYSTEM

(75) Inventors: Peter R. Holloway, Groveland, MA (US); Eric D. Blom, Wakefield, MA (US); Jun Wan, Haverhill, MA (US); Stuart H. Urie, Milford, NH (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/402,658

(22) Filed: Mar. 27, 2003

(51) Int. Cl.[7] ............................. G01K 7/01; H03M 3/00
(52) U.S. Cl. ....................... 374/170; 374/178; 374/171; 341/143
(58) Field of Search ................................. 374/170, 178, 374/173, 168, 172, 171; 257/470; 327/512, 336; 341/143

(56) References Cited

U.S. PATENT DOCUMENTS

| | | | |
|---|---|---|---|
| 4,096,451 A | | 6/1978 | Pradal |
| 4,117,722 A | * | 10/1978 | Helmstetter ................. 374/171 |
| 4,121,461 A | * | 10/1978 | Butler et al. ................. 374/171 |
| 4,939,516 A | * | 7/1990 | Early ......................... 341/143 |
| 5,159,341 A | | 10/1992 | McCartney et al. |
| 5,461,381 A | | 10/1995 | Seaberg |

(List continued on next page.)

FOREIGN PATENT DOCUMENTS

GB          2031193 A       4/1980

JP          55000476 A  *  1/1980  ............ G01K/7/24

OTHER PUBLICATIONS

Horowitz et al, The Art of Electronics, 2nd edition, 1989, pp. 628–629.*

Anton Bakker, Johan H. Huijsing, "Micropower CMOS Temperature Sensor with Digital Output", IEEE Journal of Solid–State Circuits, vol. 31, No. 7, Jul. 1996, pp. 933–937.

*Primary Examiner*—Diego Gutierrez
*Assistant Examiner*—Mirellys Jagan
(74) *Attorney, Agent, or Firm*—Patent Law Group LLP; Carmen C. Cook

(57) ABSTRACT

A digitizing temperature measurement system for providing a digital temperature measurement includes an excitation source for providing switched excitation currents to two or three temperature sensing elements and an ADC circuit including a charge-balancing modulator and a digital post processing circuit. The system utilizes synchronous AC excitation of the temperature sensing elements and an AC coupled analog-to-digital converter input. The temperature measurement system also implements correlated double sampling for noise cancellation to provide low noise and highly accurate analog-to-digital conversions. The modulator receives a charge domain reference signal generated by a reference charge packet generator incorporating a charge based bandgap subsystem. Therefore, the temperature measurement system can be operated at very low supply voltages, such as 1.0 Vdc. A low noise and highly accurate temperature measurement system is thus realized where temperature measurements of very high resolutions (up to 16 bit) can be attained.

26 Claims, 5 Drawing Sheets

U.S. PATENT DOCUMENTS

| | | | |
|---|---|---|---|
| 5,655,305 A | 8/1997 | Fletcher | 374/170 |
| 5,659,314 A * | 8/1997 | Tokura et al. | 341/143 |
| 5,675,334 A | 10/1997 | McCartney | |
| 5,691,720 A | 11/1997 | Wang et al. | |
| 5,870,048 A | 2/1999 | Kuo et al. | |
| 5,982,221 A | 11/1999 | Tuthill | 327/512 |
| 5,982,315 A | 11/1999 | Bazarjani et al. | |
| 6,008,685 A | 12/1999 | Kunst | 327/512 |
| 6,019,508 A * | 2/2000 | Lien | 374/178 |
| 6,037,887 A | 3/2000 | Wu et al. | |
| 6,097,239 A * | 8/2000 | Miranda et al. | 327/512 |
| 6,118,326 A | 9/2000 | Singer et al. | |
| 6,147,550 A | 11/2000 | Holloway | 327/544 |
| 6,160,393 A | 12/2000 | Ahn et al. | |
| 6,183,131 B1 | 2/2001 | Holloway et al. | 374/172 |
| 6,332,710 B1 * | 12/2001 | Aslan et al. | 374/183 |
| 6,609,419 B1 | 8/2003 | Bankart et al. | |
| 6,674,185 B2 * | 1/2004 | Mizuta | 307/651 |
| 6,679,628 B2 * | 1/2004 | Breinlinger | 374/178 |
| 6,736,540 B1 * | 5/2004 | Sheehan et al. | 374/183 |
| 6,750,796 B1 * | 6/2004 | Holloway et al. | 341/143 |

* cited by examiner ions: U.S.
DIGITIZING TEMPERATURE MEASUREMENT SYSTEM

CROSS-REFERENCE TO RELATED APPLICATIONS

This application is related to the following concurrently filed and commonly assigned U.S. patent applications: U.S. patent application Ser. No. 10/401,835, entitled "Low Noise Correlated Double Sampling Modulation System," of Peter R. Holloway et al.; U.S. patent application Ser. No. 10/402,447, entitled "Constant Temperature Coefficient Self-Regulating CMOS Current Source," of Peter R. Holloway et al.; and U.S. patent application Ser. No. 10/402,080, entitled "A Constant RON Switch Circuit with Low Distortion and Reduction of Pedestal Errors," of Peter R. Holloway. The aforementioned patent applications are incorporated herein by reference in their entireties.

FIELD OF THE INVENTION

The invention relates to a digitizing temperature measurement system and, in particular, to a digitizing temperature measurement system utilizing charge domain reference signals.

DETAILED DESCRIPTION OF THE PREFERRED EMBODIMENTS

Figure 1:
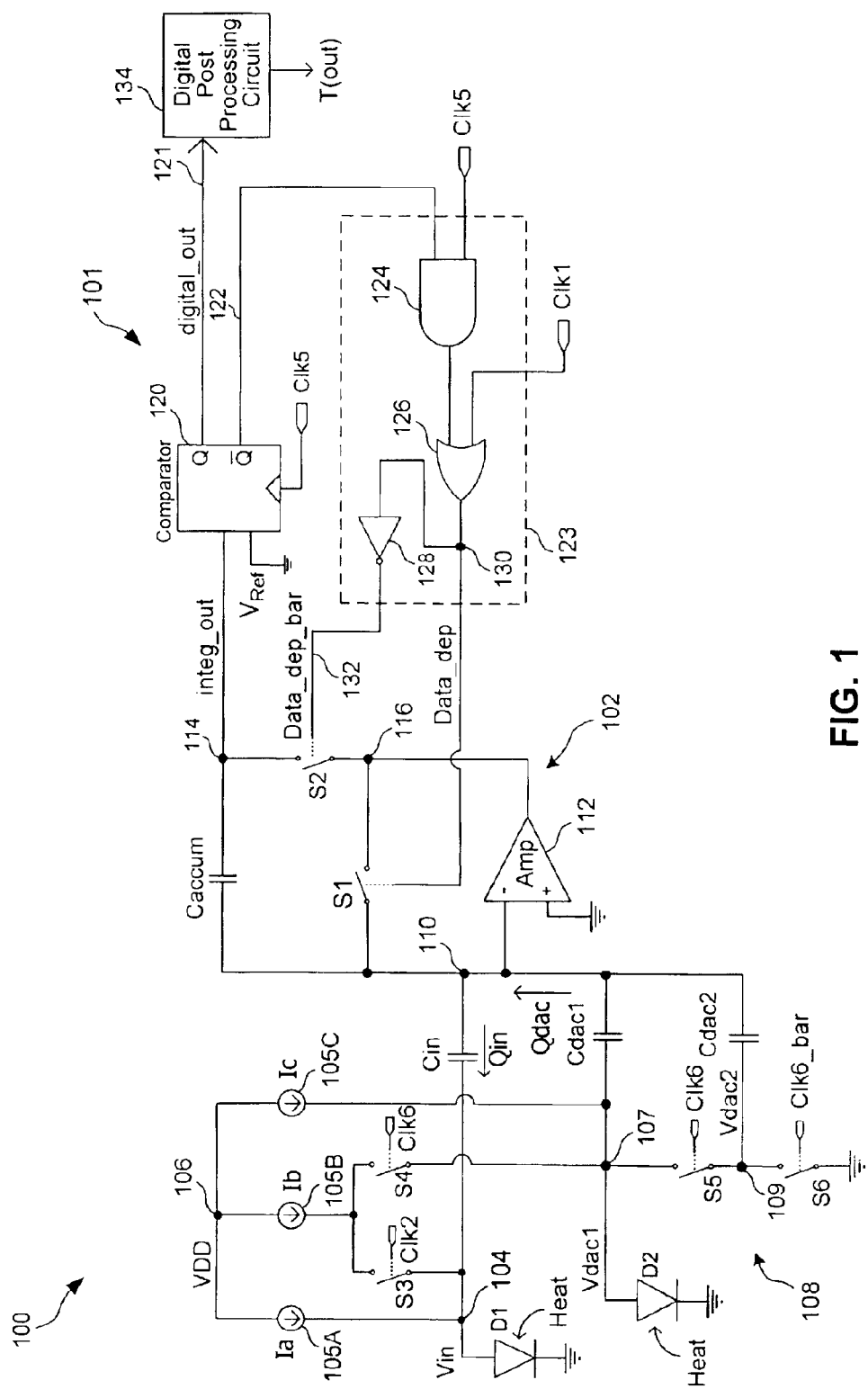
FIG. 1 is a schematic diagram of a digitizing temperature measurement system according to one embodiment of the present invention.

In accordance with the principles of the present invention, a digitizing temperature measurement system of the present invention operates to measure the ambient temperatures using two or more isothermal temperature sensing elements, such as diodes, and convert the temperature measurement to a digital number. The system utilizes synchronous AC excitation of the temperature sensing elements and AC coupled analog-to-digital converter (ADC) inputs, thereby eliminating the use of switched capacitor circuits known for introducing undesired kT/c thermal noise. The temperature measurement system of the present invention also implements correlated double sampling at the ADC inputs for canceling 1/f noise and dc offset voltage and dc offset voltage drift which may be present at the ADC and adversely affecting the performance of the temperature measurement system. As a result, a low noise and highly accurate temperature measurement system is realized where temperature measurement of a very high resolution (up to 16 bit) can be attained.

A salient feature of the temperature measurement system of the present invention is the use of charge domain reference signals in the ADC circuit which permits the system to operate at very low supply voltages. In the digitizing temperature measurement system of the present invention, the ADC circuit utilizes a unique reference charge packet generator which is a charge based bandgap subsystem for generating the reference signals. Charge components equivalent to the two separate voltage components of an equivalent bandgap voltage reference are separately generated and are simultaneously combined in the charge domain, thereby generating the reference signal without the requirement of the equivalent voltages ever being summed in the voltage domain. As commonly understood, a bandgap voltage reference includes two voltage components, one component having positive temperature coefficient and one component having negative temperature coefficient. In the unique reference charge packet generator of the present invention, the charge equivalent of the two voltage components is generated. Thus, the reference charge packet generator generates a first component charge packet having positive temperature coefficient and a second component charge packet having negative temperature coefficient and sums the two component charge packets together in the charge domain to generate the reference signal for the temperature measurement system in the form of a reference charge packet.

As a result of the charge domain operation, the charge based bandgap subsystem requires minimum voltage levels of roughly one half the usual bandgap voltage (1.22 Volts) to operate. Thus, the temperature measurement system of the present invention requires a minimum supply voltage that is slightly higher than the voltage drop of a diode. As a result, the temperature measurement system of the present invention allows accurate operation at reduced supply voltages. The ability to operate at reduced supply voltages is not readily realizable in conventional temperature measurement systems which typically require a 1.22-volt bandgap voltage and additional voltage headroom to generate the reference signals.

According to another aspect of the present invention, the temperature measurement system of the present invention embodies a novel output steering circuit to synchronously rectify the AC coupled repetitive waveforms generated by the synchronous switched current excitation of the input diode and by the reference charge packet generator. In one embodiment, the input charge packet and one of the two component charge packets are AC coupled without switching of the input capacitors. In another embodiment, the input signal and both of the component charge packets are AC coupled without switching of the input capacitors. Thus, the temperature measurement system of the present invention implements charge balancing while requiring only minimal or no alteration to the input topology of the ADC circuit.

According to yet another aspect of the present invention, the temperature measurement system of the present invention implements time sharing of the excitation current source for input signal generation and for ADC reference signal generation. Specifically, in one embodiment, the temperature measurement system uses a switched current excitation source in a time interleaved manner for driving the temperature-sensing diodes and generating both the temperature dependent input signal and the reference signals of the analog-to-digital converter (ADC). By time sharing the excitation current and using isothermal diodes for both input sensing and ADC reference generation, the temperature measurement system can be designed to exhibit precise hyperbolic linearity correction, which greatly reduces linearity errors in temperature measurements at temperature extremes.

System Overview

FIG. 1 is a schematic diagram of a digitizing temperature measurement system according to one embodiment of the present invention. Generally, digitizing temperature measurement system 100 (hereinafter "system 100") includes an excitation source for providing a switched excitation current to two temperature sensing elements and an ADC circuit for sampling the input signal and digitizing the input signal to provide a digital temperature output signal. The ADC circuit includes a charge-balancing modulator 101 and digital post processing circuit 134. Modulator 101 of the ADC circuit of system 100 includes an integrator 102 and a reference charge packet generator 108 for generating a charge domain reference signal (Qdac) for the modulator.

Referring to FIG. 1, digitizing temperature measurement system 100 is configured to sample and digitize an analog input signal generated by a temperature sensing diode D1. The analog input signal to system 100 is a step input voltage Vin at input node 104 that is indicative of the temperature to which diode D1 is exposed.

In the embodiment shown in FIG. 1, system 100 implements a two-diode configuration where one diode (D1) is used to generate the analog input signal for temperature measurement and the other diode (D2) is used to generate the ADC reference signal for the ADC circuit. By placing the two diodes in close proximity to each other, the two diodes are thermally connected in that both diodes will be at the same temperature. In the following description, diode D1 will be referred to as the "input diode" and diode D2 will be referred to as the "reference diode." As will be described in more detail below, in other embodiments, temperature measurement system 100 can be implemented in a three-diode configuration. The two-diode configuration of temperature measurement system 100 in the present embodiment is illustrative only. The two-diode configuration in the present embodiment has the advantage of eliminating 2 of 3 possible switched input capacitor thermal (kT/C) noise sources at the input of the temperature measurement system. However, other configurations provide advantages that may be useful in other applications, as will be explained below.

In the present embodiment, diodes D1 and D2 are implemented as two diode-connected bipolar transistors. In other embodiments, diodes D1 and D2 can be implemented as p-n junction diodes.

Temperature measurement system 100 employs synchronous AC excitation of the temperature sensing diode D1. Thus, input voltage step Vin is generated and sampled at predetermined, fixed time intervals synchronous with the operation of integrator 102 of the ADC of system 100. Furthermore, the excitation source of system 100 is time-shared between the input diode and the reference diode. Thus, the system can realize a partially ratiometric mode of operation. That is, any slow change in the shared excitation current will affect the magnitude of the input voltage step Vin and partially affect in the same direction the magnitude of the voltage step used to generate the ADC reference signal. Hence, slow perturbations to the excitation current, such as 1/f noise, are rejected in part before they degrade the digital bit decisions made in the ADC circuit.

Referring to FIG. 1, the excitation source of system 100 includes a first current source 105A providing a current Ia to input diode D1 (node 104), a second current source 105B providing a current Ib which is switchably connected to input diode D1 through a switch S3 and switchably connected to reference diode D2 (node 107) through a switch S4, and a third current source 105C providing a current Ic to reference diode D2. Switch S3 is controlled by a clock signal Clk2 and switch S4 is controlled by a clock signal Clk6. Thus, diode D1 is driven either by current Ia (when switch S3 is open) or by current Ia+Ib (when switch S3 is closed). Similarly, diode D2 is driven either by current Ic (when switch S4 is open) or by current Ic+Ib (when switch S4 is closed). When diode D1 is a diode-connected bipolar transistor, step input voltage Vin can be expressed as a voltage ΔVin which is the difference between a base-to-emitter voltage $V_{BEH1}$ when diode D1 is excited by current Ia+Ib and a base-to-emitter voltage $V_{BEL1}$ when diode D1 is excited by current Ia only. As is well known in the art, the difference between the base-to-emitter voltages of a bipolar junction driven at different current densities is a voltage that has a positive temperature coefficient. Thus step input voltage (or voltage ΔVin) is a voltage proportional to absolute temperature.

In the present embodiment, current sources 105A, 105B and 105C are coupled between the Vdd supply voltage node 106 and the current input nodes (ADC Input node 104 or DAC input node 107 or both). To improve the performance of system 100, current sources 105A to 105C can be derived from a precision constant temperature coefficient current source with high power supply rejection ratio (PSRR). A precision current source with high PSRR is described in copending and commonly assigned U.S. patent application Ser. No. 10/402,447, entitled "A Constant Temperature Coefficient Self-Regulating CMOS Current Source," of Peter K Holloway et al., filed Mar. 27, 2003, which patent application is incorporated herein by reference in its entirety. In one embodiment of the present invention, each of current sources 105A, 105B and 105C is implemented as a cascaded PMOS current source whose current is mirrored from the reference current described in the aforementioned patent application.

The analog step input voltage signal Vin generated by input diode D1 is coupled to modulator 101 of the ADC circuit of system 100 to be sampled and digitized. In the present embodiment, modulator 101 is implemented as a charge balancing modulation system described in copending and commonly assigned U.S. patent application Ser. No. 10/401,835, entitled "Low Noise Correlated Double Sampling Modulation System," of Peter R Holloway et al., filed Mar. 27, 2003, which patent application is incorporated herein by reference in its entirety. The operation method and theory of modulator 101 are described in detail in the aforementioned patent application and will be repeated here only as necessary to explain the operation of temperature measurement system 100.

Modulator 101 of temperature measurement system 100 is primarily an AC coupled system. In the present embodiment, the step input voltage Vin and the ADC reference voltage Vdac1 are AC coupled through their respective input capacitors to the ADC circuit. This form of true AC coupling does not require the switching of either end of the input capacitor. In the present embodiment, the charge associated with voltage Vdac2 is coupled to the ADC circuit using a switched capacitor technique. In an alternate embodiment, voltage Vdac2 can also be AC coupled to the ADC circuit, as will be explained in more detail below with reference to FIG. 5. When the input voltage step Vin and both of the ADC reference voltages Vdac1 and Vdac2 are AC coupled to the ADC circuit, modulator 101 becomes a wholly AC coupled system.

When AC coupling is used, only changes in the input voltage or the respective ADC reference voltage are measured and provided to their respective nodes in the ADC circuit. By virtue of using AC coupling of the input voltage signal, the DC voltage level at input node Vin is irrelevant to the operation of system 100. Thus, the temperature measurement system of the present invention can be advantageously applied to measure with great precision the small signal ΔVin, even though ΔVin is superimposed upon the much larger DC voltage given by the forward biased diode drop across D1. For example, in one embodiment, the DC component of the waveform at the sense diode D1 is approximately 0.7 Volts at room temperature while the signal ΔVin is approximately 65 mV. This type of precision temperature measurement cannot be readily achieved in conventional temperature measurement systems where DC coupled modulators are used.

Referring to FIG. 1, modulator 101 includes an integrator 102 for receiving step input voltage Vin on node 104 and integrating the charge associated with the step change in voltage Vin. In the present embodiment, integrator 102 of modulator 101 is formed by an input capacitor Cin, an operational amplifier 112 and an accumulation capacitor Caccum. Input capacitor Cin is coupled between input node 104 and a node 110 which is the inverting input terminal of amplifier 112. The non-inverting input terminal of amplifier 112 is connected to the ground potential. A switch S1, controlled by a data dependent (Data_dep) signal, is connected between the inverting input terminal (node 110) and the output terminal (node 116) of amplifier 112. When switch S1 is closed, a short-circuited negative feedback loop is formed around amplifier 112 and integrator 102 is in an inactive mode.

When step input voltage Vin is coupled through input capacitor Cin, integrator 102 receives an input signal in the form of an input charge packet Qin. Input charge packet Qin is the charge that is transferred through capacitor Cin due to the voltage change at voltage Vin. When the amplitude of the step input voltage Vin is expressed as ΔVin, the transferred charge is given by:

$$Q_{in}=C_{in}\Delta Vin, \text{ or}$$

$$Q_{in}=C_{in}(V_{BEH1}-V_{BEL1})$$

where the charge Qin is transferred through Cin to ground. In modulator 101, the charge Qin is transferred through Cin to node 110 which is a virtual ground node of amplifier 112. Note that in the present illustration, input charge packet Qin is shown as flowing from node 110 to node 104 (also referred to as a negative charge packet). The direction of flow for input charge packet Qin is a function of the polarity of step input voltage Vin that is sampled and used to generate input charge packet Qin. Specifically, when the negative-going transition of voltage Vin is sampled, input charge packet Qin flows out of node 110 of integrator 102 and a "negative" charge packet results. However, if the control signals were modified so that a positive-going transition of voltage Vin is sampled, input charge packet Qin would flow into node 110 of integrator 102 and a "positive" charge packet results. In the present embodiment, charge balancing modulator 101 determines the value of the step input voltage Vin by balancing a negative input charge packet with a positive reference charge packet, as will be explained in more detail below. In other embodiments, a positive input charge packet can be used as long as the polarity of the reference charge packet and the polarity of either the analog signals (integ_out or digital out) or of the data dependent control signals are modified accordingly.

Amplifier 112 of integrator 102 also receives a reference signal in the form of a reference charge packet Qdac at the inverting input terminal (node 110). As mentioned above, in the present embodiment, the ADC circuit of system 100 utilizes a unique charge based bandgap reference subsystem for generating the reference signal Qdac. The charge based bandgap subsystem requires supply voltage levels only one half as large as the conventional 1.22 volts bandgap references. Minimizing the required operational voltage range of the reference generation circuit allows highly accurate ADC operation at low supply voltages and at reduced power consumption levels. Furthermore, the ability to operate at low supply voltages permits the temperature measurement system of the present invention to be fabricated using small geometry integrated circuit CMOS processes which integrated circuits must operate at very low supply voltages.

Referring to FIG. 1, reference charge packet generator 108 includes diode D2 receiving a switched excitation current (Ic or Ic+Ib) from current source 105B and 105C. As a result of the application of the switched excitation current, a step voltage Vdac1 develops at diode D2 (node 107). The magnitude of step voltage Vdac1 is the difference in the base-to-emitter voltages of diode D2 due to the change in the excitation current. Specifically, voltage step Vdac1 can be expressed as the difference between a $V_{BEH2}$ voltage when diode D2 is excited by current Ic+Ib and a $V_{BEL2}$ voltage when diode D2 is excited by current Ic. Thus, the voltage step Vdac1 has a positive temperature coefficient as is well understood in the art.

Voltage step Vdac1 from diode D1 is AC coupled through a capacitor Cdac1 to the input node 110 of integrator 102. The charge transferred through capacitor Cdac1 can be expressed as:

$$Q_{dac1}=C_{dac1}\Delta V_{BE2}$$

where voltage $\Delta V_{BE2}$ is the step voltage Vdac1 generated by diode D2 or $\Delta V_{BE2}=(V_{BEH2}-V_{BEL2})$.

Reference charge packet generator 108 further generates a second charge packet Qdac2 to be combined with charge packet Qdac1 at the input node 110 of integrator 102 to form the reference charge packet Qdac of the reference charge packet generator. Specifically, the second charge packet Qdac2 is generated by the action of a switch S5 coupled between node 107 (the Vdac1 voltage) and node 109 (a Vdac2 voltage) and a switch S6 coupled between node 109 (the Vdac2 voltage) and the ground node. Switch S5 and switch S6 are controlled by complementary clock signals Clk6 and Clk6_bar, respectively. Before clock Clk6 is asserted, switch S5 is open and switch S6 is closed to discharge voltage Vdac2 to ground. Since clock signal Clk6 also controls switch S4 for providing the additional excitation current Ib to diode D2, when clock signal Clk6 is asserted, switches S4 and S5 will both be closed and voltages Vdac1 and Vdac2 at nodes 107 and 109 are both at the $V_{BEH2}$ voltage where diode D2 is excited by current Ic+Ib. As a result, voltage Vdac2 at node 109 will exhibit a positive voltage step having a magnitude of $V_{BEH2}$. As is well known in the art, the base to emitter voltage of a bipolar transistor has a negative temperature coefficient. Therefore, voltage Vdac2 has a negative temperature coefficient.

The voltage step Vdac2 at node 109 is coupled through a switched capacitor Cdac2 to the input node 110 of integrator 102. The charge transferred through capacitor Cdac2 can be expressed as:

$$Q_{dac2}=C_{dac2}V_{BEH2}.$$

The charge packet Qdac2 is summed with the charge packet Qdac1 to generate reference charge packet Qdac which is the reference signal for the ADC circuit of temperature measurement system 100. Thus, reference charge packet Qdac is given as follows:

$$Q_{dac} = C_{dac1}\Delta V_{BE2} + C_{dac2}V_{BEH2}.$$

Reference charge packet Qdac is a positive charge packet if the positive-going transitions of voltages $\Delta V_{BE2}$ and $V_{BEH2}$ are used to generate the charge packet. Similarly, reference charge packet Qdac is a negative charge packet if the negative-going transitions of voltages $\Delta V_{BE2}$ and $V_{BEH2}$ are used to generate the charge packet. As explained above, the polarity of reference charge packet Qdac is opposite the polarity of the input charge packet Qin to implement charge balancing in modulator 101. Furthermore, the magnitude of reference charge packet Qdac is indicative of the full range of temperature measurement desired for temperature measurement system 100. That is, during normal operation, input charge packet Qin will always be as large as or smaller than reference charge packet Qdac.

In the present embodiment, the separate generation of charge packet Qdac1 and charge packet Qdac2 allows their relative magnitude to be easily controlled and thus allows easy implementation of hyperbolic linearity correction in temperature measurement system 100. As a result, a highly linear and accurate temperature output signal is produced despite nonlinearity in the equivalent reference voltage. Hyperbolic linearization is described in detail in commonly assigned U.S. Pat. No. 6,183,131, entitled "Linearized Temperature Sensor," of Peter R. Holloway et al., issued Feb. 6, 2001, which patent is incorporated herein by reference in its entirety. Hyperbolic linearization can be applied to greatly reduce the inherent temperature nonlinearity of a typical silicon bandgap based temperature sensor at the expense of inducing minor gain and offset errors. In the present implementation, the sizes of capacitors Cdac1, Cdac2 and Cin are varied to obtain the desired linearization. Because the input diode and the reference diode are at the same temperature, the equivalent reference voltage and thus the gain of the ADC circuit are changed in accordance with the same sensed temperature so that a highly accurate temperature measurement can be realized. In one embodiment, capacitor Cdac1 is m times larger than capacitor Cdac2.

Integrator 102 of modulator 101 includes capacitor Caccum switchably connected across amplifier 112 for storing the charge packets provided at input node 110. Specifically, one plate of capacitor Caccum is connected to the inverting input terminal (node 110) of amplifier 112 while the other plate of capacitor Caccum is connected to the output terminal (node 116) of amplifier 112 through a switch S2. Switch S2 is controlled by the inverse of the data dependent signal (Data_dep_bar). When switch S2 is closed, capacitor Caccum is connected in the negative feedback loop of amplifier 112 and integrator 102 is in an active mode. When switch S2 is open, capacitor Caccum is disconnected from amplifier 112 and integrator 102 is in an inactive mode whereby the voltage across and the charge stored on capacitor Caccum are not affected by the operation of amplifier 112. As will become apparent in the description below, switch S1 and switch S2, controlled by Data_dep signal and its inverse respectively, operate in a complementary fashion (one switch closes while another opens) such that integrator 102 is either active (amplifier 112 connected to capacitor Caccum by action of switch S2) or inactive (amplifier 112 shorted by action of switch S1). As a result, capacitor Caccum integrates or discards the charge packets present at input node 110, depending on the state of the Data_dep signal.

The operation of modulator 101 will be described in brief here. Based on the control of clock signals Clk1 and Clk2, integrator 102 uses gated continuous time integration to accumulate charge from the input charge packet Qin. Then, integrator 102 receives a periodic, non-data dependent reference charge packet from reference charge packet generator 108 which reference charge packet Qdac is used, in a data dependent manner, to balance the charge accumulated due to the input voltage step Vin. Clock signal Clk6 controls the frequency of the application of the reference charge packet to the inverting input terminal (node 110) of amplifier 112. Specifically, in modulator 101, reference charge packet generator 108 always supplies a charge packet. However, integrator 102 is reconfigured by the operation of switches S1 and S2 in a data dependent manner so as to either allow the accumulation of the "bucking" reference charge packet at capacitor Caccum or to keep the amplifier in an inactive (or autozero) mode and ignore the applied "bucking" reference charge packet. For a detailed description of the operational characteristics of modulator 101, refer to aforementioned patent application entitled "Low Noise Correlated Double Sampling Modulation System".

In operation, when step input voltage Vin makes a negative-going transition from $V_{BEH1}$ to $V_{BEL1}$, a negative charge packet Qin is generated which has the effect of removing charge from capacitor Caccum to be placed on capacitor Cin. If the charge at capacitor Caccum falls below a certain threshold level, integrator 102 replaces the charge at capacitor Caccum with a big reference charge packet from reference charge packet generator 108. If the charge at capacitor Caccum is above the threshold level, then integrator 102 keeps removing charge from capacitor Caccum due to negative input charge packet Qin. Thus, over several sampling cycles, capacitor Caccum holds the running difference between the sum of the input charge packets Qin and the sum of the reference charge packets Qdac that have been applied.

Returning to FIG. 1, the output voltage integ_out of integrator 102 (at node 114) is coupled to a comparator 120 comparing the voltage integ_out with a reference voltage $V_{Ref}$. In the present embodiment, reference voltage $V_{Ref}$ is a ground voltage. If the integ_out value is greater than $V_{Ref}$, comparator 120 generates a logical "1" as the output signal ("Q"). If the integ_out value is less then $V_{Ref}$, comparator 120 generates a logical "0" as the output signal ("Q"). Comparator 120 is controlled by clock signal Clk5 such that comparisons are triggered on the rising edge of clock signal Clk5 and the comparator output signals Q and $\overline{Q}$ are valid for at least the duration of clock Clk5.

It is instructive to note that the output signal of integrator 102 is taken from the right plate of capacitor Caccum and not from the output terminal of amplifier 112 as is done in conventional modulators. This construction provides several advantages. First, the integrator output signal integ_out is continuously connected to the subsequently circuitry without the use of intervening switches. Thus, the integ_out signal remains valid even if the integrator is in an inactive mode. The integ_out signal can be used by the subsequent analog stages even during the time interval when the integrator amplifier is in a correlated double sampling mode. Using the valid signal during the correlated double sampling time can reduce the number of clock phases required for the modulator operation and make possible pipelined implementation of modulator 101. A second advantage concerns kT/C noise generated by the opening of switch S2. Because the output signal is taken from a point inside the feedback loop formed by amplifier 112, switch S2 and capacitor Caccum, the error charge generated by the opening of switch S2 is forced by the loop gain to partially be absorbed by the amplifier output circuits. Thus the output signal integ_out at node 114 exhibits diminished kT/C noise error compared to architectures where capacitor Caccum is switched using conventional switched capacitor techniques.

The output signal digital_out from comparator 120 is a single bit digital data stream on terminal 121 which digital data stream is provided to digital post processing circuit 134 for filtering and determining the digital value thereof. In the present embodiment, the digital_out signal has an average ones density that is proportional to the average amplitude of the input voltage step Vin due to the switched current excitation over the time period examined.

Modulator 101 includes a logic circuit 123 for implementing data dependent charge accumulation at integrator 102. That is, reference charge packets are continuously generated at reference charge packet generator 108 but the modulation system determines whether to accumulate the charges at capacitor Caccum in a data dependent manner. Specifically, the inverse of the digital_out signal, on terminal 122, is coupled to logic circuit 123 which generates the data dependent Data_dep signal (on node 130) and its inverse Data_dep_bar (on node 132). Data_dep signal is coupled to control switch S1 and Data_dep_bar signal is coupled to control switch S2 of integrator 102. In this manner, integrator 102 is activated or deactivated based on the data dependent signal and its inverse. As a result, the reference charge packet Qdac is accumulated or ignored by the action of switches S1 and S2.

Logic circuit 123 is controlled by a clock signal Clk5 and is activated on the rising edge of clock Clk5 for generating the Data_dep and Data_dep bar signals. Logic circuit 123 also receives a clock signal Clk1 which controls integrator 102 for performing correlated double sampling, as will be described in more detail below. In the present embodiment, logic circuit 123 includes an AND logic gate 124 receiving the inverse of the digital_out signal and clock Clk5. The output of the AND gate is coupled to an OR logic gate 126 which also receives clock Clk1 as input. The output of OR gate 126 is the Data_dep signal. An inverter 128 is used to generate the inverse signal Data_dep_bar. Note that FIG. 1 merely illustrates one embodiment of logic circuit 123 and one of ordinary skill in the art would appreciate that logic circuit 123 can be implemented in other manners using other combination of logic gates to generate the same data dependent signals.

In operation, during the charge balancing phase, when the voltage integ_out at the output node 114 is zero or a positive voltage, comparator 120 generates a logical hi value ("1") as digital_out. The inverse of digital_out on line 122 is thus a logical low value. Accordingly, Data_dep_bar signal on node 132 is asserted and switch S2 is closed to activate the integrator. The reference charge packet Qdac from the reference charge packet generator circuit is thus accumulated at capacitor Caccum (which has the effect of decreasing the voltage integ_out). Alternately, when the voltage integ_out at the output node 114 is a negative voltage, comparator 120 generates a logical low value ("0") as digital_out. The inverse of digital_out on line 122 is thus a logical hi value. Accordingly, Data_dep signal on node 130 is asserted and switch S1 is closed to short out (or deactivate) the integrator. As a result, the reference charge packet Qdac from reference charge packet generator 108 is not accumulated and is dissipated by the amplifier output circuits. In this manner, modulator 101 accumulates the charge from the reference charge packet in a data dependent manner.

As mentioned above, modulator 101 employs correlated double sampling (CDS) to cancel the amplifier DC offset voltage, 1/f noise and wideband amplifier noise. Specifically, during the CDS phase of the sampling cycle activated by clock signal Clk1, integrator 102 is shorted out and capacitor Caccum is disconnected from the amplifier. Any offset voltage, input 1/f noise and wideband voltage noise, collectively referred to as "the amplifier error voltage", at the input terminals of amplifier 112 also appear at the output terminal (node 116) of amplifier 112. Due to the short-circuited connection at amplifier 112, the voltage at the right plate of capacitor Cin is thus charged to the amplifier error voltage. In this manner, the amplifier error voltage is stored on capacitor Cin and is cancelled out at amplifier 112 during the subsequent input acquisition phase. Thus, a highly precise output voltage can be generated at amplifier 112, free of offset errors and amplifier noise.

As described above, the ADC circuit of temperature measurement system 100 is a charge balancing ADC where the modulator uses the reference charge packets to cancel the accumulated input charge. The number of times that the input charge must be balanced is often the digital parameter of interest as it corresponds to a quantized estimate of the average applied analog input signal step Vin. In the present embodiment, the digital parameter of interest is the sensed temperature of input diode D1. Thus, modulator 101 of temperature measurement system 100 is operated repeatedly over a large number of sampling cycles to generate a series of digital bit decisions that form an ones density data stream as the digital_out signal.

Figure 2:
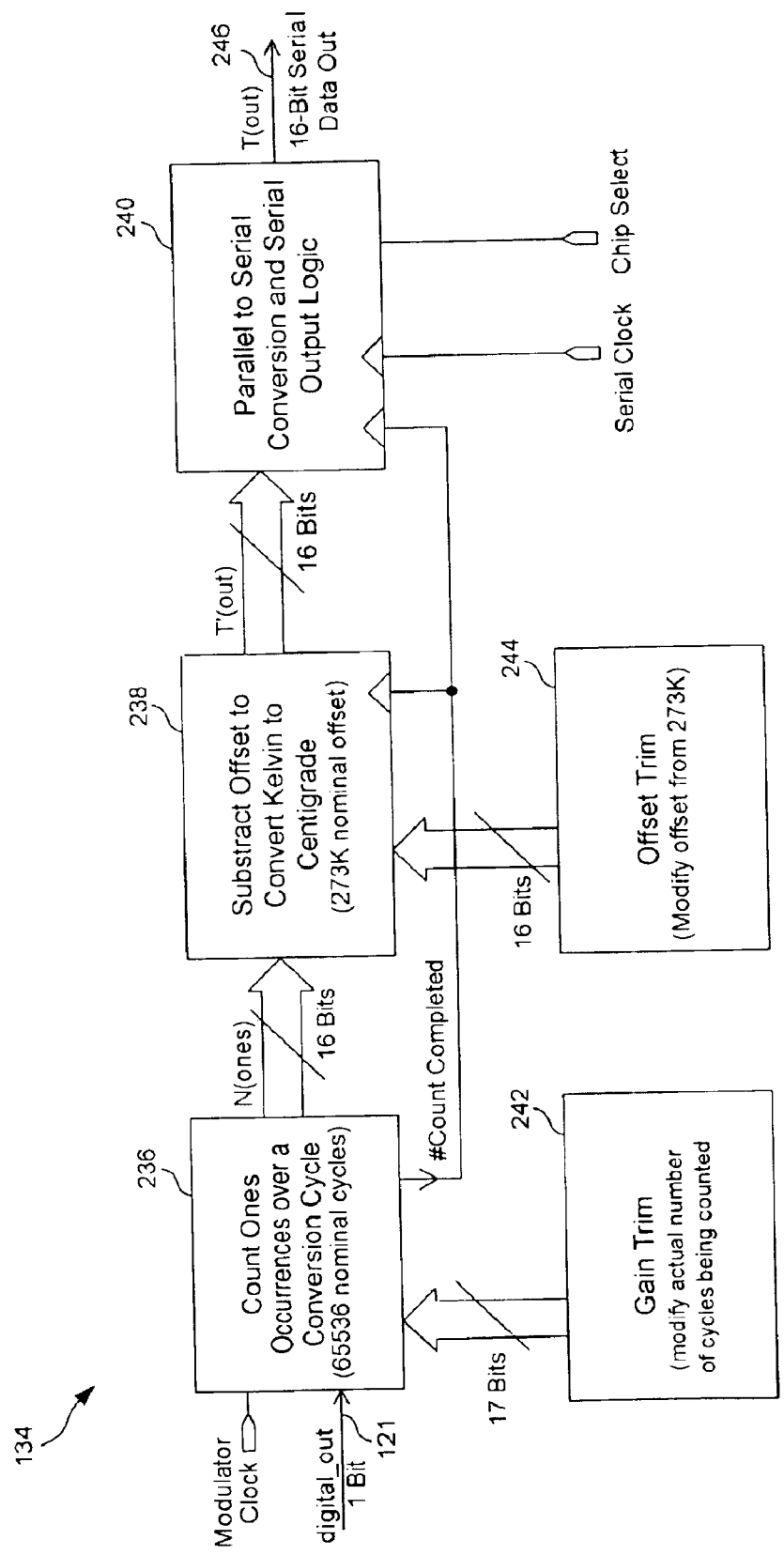
FIG. 2 is a block diagram of a digital post processing circuit which can be incorporated in the temperature measurement system of FIG. 1 according to one embodiment of the present invention.

Referring to FIG. 1, the digital_out signal from modulator 101 is coupled to digital post processing circuit 134 for digital processing. FIG. 2 is a block diagram of a digital post processing circuit which can be incorporated in temperature measurement system 100 according to one embodiment of the present invention. In the present embodiment, digital post processing circuit 134 is illustrated as providing a 16-bit digital output word as the temperature output signal T(out). Furthermore, in the present embodiment, digital post processing circuit 134 is illustrated as providing a serial data output. The 16-bit serial data output from circuit 134 is illustrative only. One of ordinary skill in the art would appreciate that digital post processing circuit 134 can be configured to generate a temperature output signal having the desired precision in either serial or parallel data format.

Referring to FIG. 2, circuit 134 includes a block 236 for counting the number of ones occurrences in digital_out signal over a conversion cycle, a block 238 for offset subtraction and a block 240 for converting the temperature output signal from parallel data format into serial data format. In the present embodiment, digital post processing circuit 134 further includes a block 242 for providing digital gain trim and a block 244 for providing offset trim.

Specifically, block 236 is coupled to receive the digital_out signal on bus 121 from modulator 101 and also to receive a modulator clock signal. To form a single 16 bit word of 16 bit precision from digital_out which is an one-bit data stream, it is necessary to count the number of "ones" present in $2^{16}$ or 65536 one-bit samples of the data stream. The counting function of block 236 can be combined with the required gain adjust functionality provided by block 242 to make the actual number of samples accumulated programmable. For instance, for temperature measurement systems whose input gain is too low, not enough "ones" would be present in 65536 samples to accumulate to the desired number. Thus, such a temperature measurement unit would be digitally trimmed to count for slightly more than 65536 samples for each conversion. Similarly, for temperature measurement systems whose gain from the input is slightly high, the unit would count too many "ones" in 65536 samples. Such unit can be digitally trimmed to count slightly less than 65536 samples. Block 236 generates an accumulated count number N(ones) of 16 bits indicative of the sensed temperature of diode D1.

A consequence of constructing a composite digital number from the addition of a large number of identically weighted samples is that the composite number so formed averages the effect of any wideband random noise over the set of samples added. The accumulation of 65536 samples corresponds to a finite impulse response digital lowpass filter described by 65536 unity-weighted coefficients. The lowpass filter characteristic of this stage of digital post processing filters out the effects of noise above roughly 1 part in 32768 of the ones density frequency, thereby greatly reducing the amount of noise within the final output numbers. In other embodiments, other decimating lowpass digital filters can be used to reduce noise level even more. However, the use of high performance decimating lowpass digital filters may increase the design complexity of the filters.

In temperature measurement system 100, the amplitude of the $\Delta V_{BE}$ diode signals approaches 0 Volts near 0 degrees Kelvin, which corresponds to −273.15 degrees Centigrade. In order to output a digital number calibrated to the Centigrade system, it is necessary to apply an offset equivalent to the 273.15 degrees difference between the two temperature units. The use of hyperbolic linearization in the ADC circuit induces an additional small offset error. Furthermore, other imperfections in temperature measurement system 100 may result in additional small offset errors, potentially of random sign. All offset sources (Kelvin/Centigrade temperature offset and offset errors) can be digitally corrected by applying an offset value adjusted by a digital offset trim within a properly selected trim range. Block 244 of digital post processing circuit 134 provides a programmable digital offset which is subtracted from the accumulated count number N(ones) to correct for the sum of all offsets. Block 238 generates a temperature output value T(out) in 16-bit parallel format.

Finally, when serial output data is desired, temperature output value is provided to block 240 to convert the 16-bit parallel data format to serial data format, under the control of a user-generated serial clock. The serial clock is used to serially clock the temperature output signal T(out) onto a data output line 246 which can be a data output pin of temperature measurement system 100. As mentioned above, block 240 is optional and is required only when serial output data is desired.

System Operation

Figure 3:
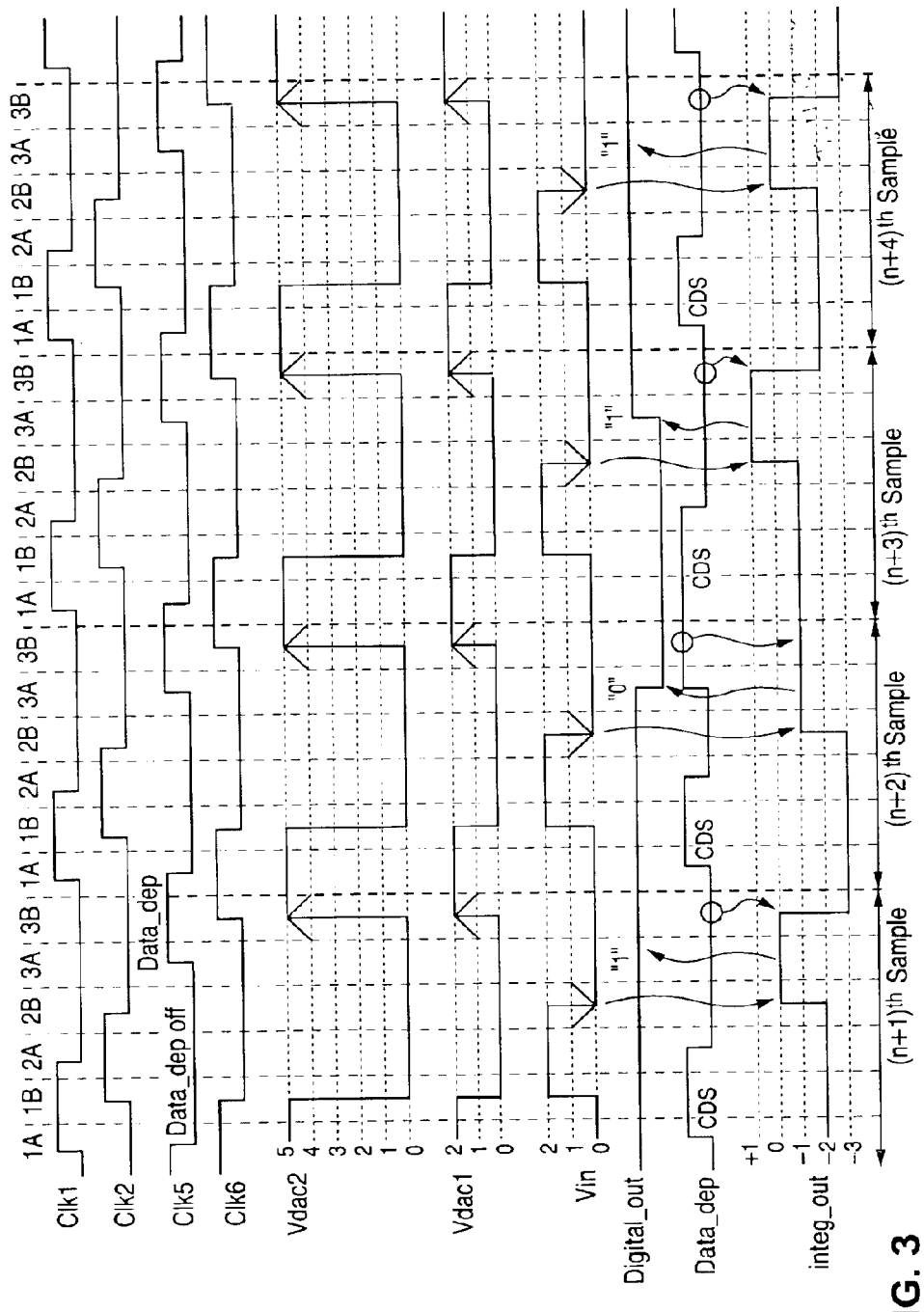
FIG. 3 illustrates one representative clocking scheme under which the temperature measurement system of the present invention can be operated.

The operation of temperature measurement system 100 will now be described with reference to the timing diagram of FIG. 3. FIG. 3 illustrates one representative clocking scheme under which the temperature measurement system of the present invention can be operated. Of course, one of ordinary skill in the art would appreciate that other clocking schemes can also be used to operate the temperature measurement system of the present invention to achieve low noise, high precision temperature measurements.

Referring to FIG. 3, the clock signal waveforms and the corresponding values for the digital_out signal, the Data_dep signal and the integ_out signal are shown for four representative samples during a conversion of the repeated step input voltage Vin. The embodiment of temperature measurement system 100 of FIG. 1 implements a first order incremental ADC, and a single conversion to obtain q-bit digital output data requires $2^q$ samples of the input voltage step. For example, to convert an analog value into a 16-bit digital output data will require 65,536 samples in a single conversion. In the present embodiment, it is assumed that the amplitude of the input voltage step Vin does not change or changes very slowly during the time of a single conversion so that dynamic measurement errors can be ignored. In one embodiment of the present invention, a conversion time of 200 ms is required to obtain digital data of 16 bit precision and a conversion time of 12.5 ms is required to obtain digital data of 12 bit precision. Therefore, as long as the sensed input condition is not changing rapidly with respect to the conversion time period, the above assumption will hold.

FIG. 3 illustrates the timing and signal waveforms for the $(n+1)^{th}$ to $(n+4)^{th}$ samples of a conversion of the ambient temperature measured by diode D1 in temperature measurement system 100 of the present invention. The initialization of system 100 and the initial conditions of the various nodes of the system are not shown in FIG. 3. In one embodiment, when system 100 implements an incremental ADC, a switch is coupled across capacitor Caccum to short out capacitor Caccum before each conversion to remove any charge stored thereon. However, the shorting of capacitor Caccum in an incremental ADC implementation between conversions is optional as any residual charge on the capacitor will only result in small measurement errors.

Each sampling cycle of system 100 can be viewed as consisting of three phases: a CDS (or autozero) phase, an input sampling and charge integration phase, and a data dependent charge balancing phase. Referring to FIG. 3, timing intervals 1A, 1B, 2A, 2B, 3A, and 3B are provided to denote the A and B portions of each of the three phases of the sampling cycle. Furthermore, signal integ_out as illustrated in FIG. 3 is a voltage signal used to indicate the amount of charge stored on capacitor Caccum. Capacitor Caccum is located within the negative feedback path of inverting amplifier 112. Because the inverting amplifier will force the left plate of capacitor Caccum at the inverting input terminal (node 110) to virtual ground, the integ_out voltage signal at the right plate of capacitor Caccum (or the integrator output node 114) is given as:

$$V_{\text{integ\_out}} = -\frac{Q_{accum}}{C_{accum}},$$

In FIG. 3, the vertical scale of the integ_out signal is divided into slices demarcating separate voltage units which voltage unit is a measurement unit used in the present description to quantify the charge stored or the charge transferred in system 100. The voltage units are defined solely to show the voltage change due to integration of one unit charge, where said unit charge will be used in the description of the operation of system 100. A "voltage unit" in FIG. 3 is merely representative and does not correspond to a voltage measurement unit in volts. The vertical scale associated with the integ_out signal does not define an absolute zero voltage reference point. However, to facilitate the description of the operation of the temperature measurement system of the present invention, an artificial zero volt reference value for the integ_out signal can be assumed to correspond to a voltage unit level between the third voltage unit and the fifth voltage unit. Similarly, voltage steps Vin, Vdac1 and Vdac2 are expressed in FIG. 3 in terms of voltage units. Voltage steps Vin, Vdac1 and Vdac2 in FIG. 3 are not drawn to scale.

At the n$^{th}$ sampling cycle, system 100 has generated a digital_out value of "1". At the end of the nth sampling cycle, capacitor Caccum has stored thereon two units of charge as a result of the charge integration and charge balancing phases during the n$^{th}$ sampling cycle. The voltage of integ_out signal at output node 114 of inverting amplifier 112 is therefore at minus two (−2) voltage units.

At the beginning of the (n+1)$^{th}$ sampling cycle (interval 1A), the input voltage Vin is stable at a low voltage level while voltages Vdac1 and Vdac2 are stable at their respective high voltage levels. During interval 1A, clock Clk5 is deasserted while clock Clk1 is asserted to initiate the correlated double sampling operation for the current sampling cycle. As a result of clock Clk1 being at a logical "hi" value, Data_dep signal is asserted (logical hi) to close switch S1 while Data_dep_bar signal is deasserted (logical low) to open switch S2. Integrator 102 is thus shorted out and is in an inactive mode. Therefore, any amplifier error voltage, such as those due to DC offset voltage and 1/f noise, appears on the amplifier output terminal. Input capacitor Cin, capacitors Cdac1 and Cdac2 are thereby precharged with the amplifier error voltage so that the amplifier error voltage is cancelled out during the sampling and charge integration phase to follow. In this manner, correlated double sampling of the modulator is effectuated.

In the present embodiment, when clock Clk1 is asserted, integrator 102 is forced to be inactive. Therefore, clock Clk1 can be used advantageously to block the sampling of undesired signal transitions. For example, when clock Clk2, controlling application of switched excitation current at input diode D1, is asserted and deasserted, input voltage step Vin switches from low to high and then vice versa. If both transitions are allowed to be accumulated by integrator 102, then the input charge Qin will cancel itself out and no charge will be accumulated at capacitor Caccum. Furthermore, in the present embodiment, to implement charge balancing in modulator 101, a positive reference charge packet is applied to integrator 102 at each sampling cycle to balance out the negative input charge packet accumulated from the ΔVin voltage. Thus, only the positive charge packet associated with the positive-going transition of voltage steps Vdac1 and Vdac2 is used and the negative charge packet associated with the negative-going transition of voltage steps Vdac1 and Vdac2 must be discarded. Therefore, in the present timing scheme, clock Clk1 is used advantageously to block the integration of charge packets generated by the undesired edge of the repetitive Vdac component signals (that is Vdac1 and Vdac2 signals).

Specifically, during interval 1A, clock Clk2 is at a logical low value while clock Clk6 is at a logical hi value. Thus, switch S3 is open and input diode D1 is being excited by current Ia only. Switch S4 is closed and reference diode D2 is being excited by current Ib+Ic. Switch S5 is also closed so that voltages Vdac1 and Vdac2 are both at their respective "high" voltage levels. During interval 1B, clock Clk2 is asserted to close switch S3 while clock Clk6 is deasserted to open switches S4 and S5. As a result, input diode D1 is excited by the application of switched current Ia+Ib and input voltage step Vin makes a low-to-high transition. On the other hand, reference diode D2 is excited by the application of current Ic only and voltage Vdac1 makes a high-to-low transition. Diodes D1 and D2 are exposed to the same ambient temperature to be measured. The change in excitation current produces a voltage change $\Delta V_{BE}$ across each diode which $\Delta V_{BE}$ voltage produced in this manner is known to vary linearly with the sensed diode temperature. Specifically, voltage Vin makes a positive-going transition having a magnitude of $\Delta V_{BE1}$ (i.e., $V_{BEH1}-V_{BEL1}$) while voltage Vdac1 makes a negative-going transition having a magnitude of $\Delta V_{BE2}$.

When clock Clk6 is deasserted, clock Clk6_bar is asserted to close switch S6. As a result, voltage Vdac2 (node 109), previously at a $V_{BEH2}$ voltage, is forced to the ground potential. Because voltage Vdac1 switches from a $V_{BEH2}$ voltage level where diode D2 is excited by current Ib+Ic to a $V_{BEL2}$ voltage level where diode D2 is excited by current Ic, the magnitude of change in voltage Vdac1 ($\Delta V_{BE2}$) is less than the magnitude of change in voltage Vdac2 ($V_{BEH2}$). Hence, in FIG. 3, voltage Vdac1 is illustrated as transitioning between two voltage units while voltage Vdac2 is illustrated as transitioning between 5 voltage units.

Because integrator 102 is deactivated during interval 1B as a result of clock Clk1, the positive-going transition of voltage Vin and the negative-going transitions of voltages Vdac1 and Vdac2 are ignored and no charge is accumulated as a result of these transitions. Specifically, the charge packets associated with these transitions are AC coupled to the input node (node 110) of amplifier 112 and are absorbed by the amplifier as the input of amplifier 112 is shorted to its output through switch S1. At the end of interval 1B, the modulator is ready to begin the input sampling and charge integration phase.

During interval 2A, clock Clk1 is deasserted. When both clocks Clk1 and Clk5 are deasserted, system 100 is put in a non-data dependent input accumulation mode. That is, data_dep signal is at a logical low value and data_dep_bar is at a logical hi value. Thus, switch S1 is open while switch S2 is closed. As a result, integrator 102 is activated.

During interval 2B, clock Clk2 is deasserted. Switch S3 is opened in response to the falling edge of clock Clk2 and diode D1 is excited by the application of switched current Ia from current source 105A. In response to the switched current excitation, input voltage step Vin makes a negative-going transition from the higher VBEH1 voltage to the lower VBEL1 voltage. The magnitude of the voltage change ΔVin or $\Delta VBE1$ is indicative of the sensed temperature of diode D1. The voltage change ΔVin is AC coupled through capacitor Cin to the inverting input terminal (node 110) of amplifier 112. Because it is assumed that the input voltage step persists for a long time as compared to the input circuit time constants, all the charge collected at the left plate of capacitor Cin associated with ΔVin is transferred to the right plate of capacitor Cin. Specifically, the charge coupled through capacitor Cin is given by:

$$Q_{in}=C_{in}\Delta V_{in}$$

where ΔVin is the change in input voltage Vin due to the synchronous switched current excitation and Cin is the value of the capacitor Cin. In the present embodiment, input charge packet Qin is associated with the falling edge of voltage Vin and thus is a negative charge packet.

Because integrator 102 is in the active mode, amplifier 112 forces the inverting input terminal (node 110) to a virtual ground. Therefore, the charge coupled through capacitor Cin is directed to capacitor Caccum. Because amplifier 112 is configured in an inverting mode, the decrease in charge stored in capacitor Caccum due to negative charge packet Qin causes an increase in the voltage at integ_out proportional to the magnitude of the accumulated charge Qin:

$$\Delta V_{\text{integ\_out}} = -\frac{\Delta Q_{accum}}{C_{accum}} = -\frac{Q_{in}}{C_{accum}} = -\Delta V_{in}\frac{C_{in}}{C_{accum}}$$

where Qaccum is the charge accumulated at capacitor Caccum, and Caccum represents the capacitance of capacitor Caccum. Note that in the present embodiment, voltage Vin has a negative-going transition. Thus, the change in voltage ΔVin has a negative polarity such that $\Delta V_{\text{integ\_out}}$ has a positive polarity.

In the present embodiment, capacitor Cin and capacitor Caccum have the same capacitance value. In one embodiment, the capacitance of capacitor Cin and of capacitor Caccum is 2 pF. In the present illustration, it is assumed that the falling edge of Vin causes two additional charge units to be removed from capacitor Caccum and thus the integ_out signal increases by two voltage units to a level of zero (0) voltage unit.

Because integrator 102 is active during the entire interval 2B, that is, the integrator is active before, during and after the Vin falling edge, continuous time integration of the input voltage step signal is realized. The use of continuous time integration to sample the input analog voltage has the effect of low pass filtering the input signal and thereby filters out any wideband noise that may present on the input signal.

Next, at interval 3A, clock Clk5 is asserted which initiates the data dependent charge balancing phase of the sample cycle. Integrator 102 is no longer forced in the active or inactive mode but instead is controlled by the value of the digital_out signal. During the charge balancing phase, modulator 101 determines in a data dependent manner whether to accumulate or disregard the positive reference charge packet to be generated by the rising edge of voltages Vdac1 and Vdac2.

Because comparator 120 is also controlled by clock Clk5, comparator 120 is interrogated on the rising edge of clock Clk5 and the digital_out value for the current sample cycle is read out of integrator 102. Because integ_out signal has a value of zero (0) voltage unit, the integ_out signal is compared with reference voltage $V_{Ref}$ at comparator 120 which is assumed to be at zero volt in the present embodiment. Because the integ_out signal is equal to or greater than voltage $V_{Ref}$, comparator 120 generates a logical hi value as the digital_out "Q" output. Thus, the digital_out signal has a valid output value of logical "1" during the time that clock Clk5 is asserted.

The digital_out signal generated by comparator 120 determines whether the subsequently generated reference charge packet will be accumulated in capacitor Caccum or discarded. When digital_out has a value of logical "1", data_dep signal has a logical low value. Thus, switch S1 is open while switch S2 is closed and integrator 102 is in an active mode. Accordingly, the reference charge packet will be accumulated. When digital_out has a value of logical "0", data_dep signal has a logical hi value. Thus, switch S1 is closed while switch S2 is open and integrator 102 is in an inactive mode. Accordingly, the reference charge packet will not be accumulated.

In the present illustration, AND gate 124 of logic circuit 123 receives as input signals clock Clk5 and the inverse of the digital_out signal ($\overline{Q}$). When clock Clk5 is asserted, the output of AND gate 124 will have the same value as the inverse of the digital_out signal ($\overline{Q}$). The output of OR gate 126 is also the same as the output of AND gate 124 as the other input of OR gate 126 (clock Clk1) is deasserted. Thus, logic circuit 123 generates a Data_dep signal which is the inverse of the digital_out signal. In the current sample cycle, digital_out has a value of "1" and thus Data_dep remains at a low logical value when clock Clk5 is asserted.

When Data_dep has a logical value of "0", switch S1 is open and switch S2, controlled by Data_dep_bar, is closed. Thus, integrator 102 is activated and is in an "accumulate" mode. During interval 3B, clock Clk6 is asserted and voltages Vdac1 and Vdac2 make their respective low-to-high transitions. Specifically, voltage Vdac1 makes a positive-going transition having a magnitude of $\Delta V_{BE2}$ while switched capacitor voltage Vdac2 makes a positive-going transition having a magnitude of $V_{BEH2}$. The sum of the charge packets generated as a result of these transitions (Qdac1 and Qdac2) form the reference charge packet Qdac which is a positive charge packet in the present illustration. Because integrator 102 is in an "accumulate" mode, the positive charge packet is accumulated at capacitor Caccum by integrator 102. As shown in FIG. 3, the integ_out value decreases by three voltage units, from 0 to −3, as a result of accumulating the positive reference charge packet (the reference charge packet is assumed to be of three (3) charge units). Note that because integrator 102 is activated during intervals 3A and 3B, that is before, during and after the rising edge of the reference charge packet, the integrator implements continuous time integration which effectuates a low-pass filter function for filtering any wideband noise on the reference charge packet signal.

At the end of the charge balancing phase, capacitor Caccum has accumulated charged based on the change in input voltage ΔVin and based on the reference charge packet, in a data dependent manner. During the $(n+1)^{th}$ sampling cycle the accumulated charge has decreased by two units and increased by three, resulting in a held charge of three charge units at capacitor Caccum and a voltage at integ_out of minus three (−3) voltage units. The temperature measurement system then proceeds to the next sampling cycle by deasserting clock Clk5 and asserting clock Clk1.

During the $(n+2)^{th}$ sampling cycle, temperature measurement system 100 operates in the same manner as described above. When the charge associated with the negative-going step ΔVin voltage, having minus two (−2) charge units, is accumulated, the charge at capacitor Caccum decreases by 2 charge units and the voltage at integ_out (node 114) increases to −1 voltage units. Because comparator 120 now acts upon an integ_out value (−1 voltage unit) that is smaller than voltage $V_{Ref}$ (0 voltage units), digital_out switches to a logical "0" value at the rising edge of clock Clk5. As a result of digital_out being at a logical "0" value, the Data_dep signal switches to a logical "1" value during the charge balancing phase (intervals 3A/3B). The state of the Data_dep signal causes switch S1 to close and switch S2 to open. Thus, integrator 102 is deactivated and capacitor Caccum is prevented from accumulating any charge from the rising edge of the reference charge packet to be generated during interval 3B. Integ_out signal thus remains at the minus one (−1) voltage unit at the end of the $(n+2)^{th}$ sampling cycle.

At the $(n+3)^{th}$ sampling cycle, the charge associated with the negative-going step ΔVin voltage, having minus two (−2) charge units, is accumulated. The charge at capacitor Caccum decreases by 2 charge units and the voltage at integ_out (node 114) increases to +1 voltage units. Because comparator 120 now read an integ_out value (+1 voltage unit) that is greater than voltage $V_{Ref}$ (0 voltage units), digital_out switches to a logical "1" value at the rising edge of clock Clk5. As a result of digital_out being at a logical "1" value, the Data_dep signal remains at a logical "0" value during the charge balancing phase (intervals 3A/3B).

The state of the Data_dep signal causes switch S1 to open and switch S2 to close. Thus, integrator 102 is activated and capacitor Caccum accumulates charge associated with the rising edge of the reference charge packet Qdac.

Thus, during the data dependent charge balancing phase, the positive reference charge packet is accumulated by capacitor Caccum and Qaccum increases by three charge units, with a corresponding decrease in the voltage at integ_out of 3 voltage units. A sum of two charge units is stored on capacitor Caccum at the end of the $(n+3)^{th}$ sampling cycle, and the voltage at integ_out is at negative two (−2) voltage units.

As shown by the operation of sampling cycles n+1 to n+3, temperature measurement system 100 implements data dependent charge balancing and the charge associated with the rising edge of voltages Vdac1 and Vdac2, which are used to generate the reference charge packet Qdac, is either accumulated or ignored depending on the value of the digital_out signal. The sample cycles are repeated until a large enough number of the digital bit decisions has been made so that the residual quantization error of the digitizing process is below certain desired application specific limits.

In sum, in the present embodiment, temperature measurement system 100 implements charge balancing by sampling only the falling edge of the input voltage step Vin and accumulating, in a data dependent manner, only the reference charge packets generated by the rising edge of voltages Vdac1 and Vdac2. Because integrator 102 is an inverting integrator, the integ_out signal increases due to the falling edge of Vin and decreases due to the positive reference charge packet.

As a result of adding and subtracting the charge due to the ΔVin voltage and the charge from the reference charge packet, the temperature measurement system generates a digital_out signal in the form of an ones density data stream. The single bit output data stream generated by comparator 120 will exhibit an ones density proportional to the amplitude of the change in input voltage ΔVin. Specifically, under the assumption that the step size ΔVin does not change appreciably over a single conversion, the average ones density is given as:

$$OnesDensity = \Delta V_{in} \frac{C_{in}}{C_{dac}V_{dac}} = \frac{Q_{in}}{Q_{dac}}$$

where Vdac denotes the sum of voltage Vdac1 and Vdac2 and Cdac denotes the parallel capacitance of capacitors Cdac1 and Cdac2. The ones density value is always less than or equal to 1 as Qin is always less than or equal to Qdac. For example, in the present illustration, the ΔVin voltage step generates an input charge Qin that has a charge unit level that is ⅔ of the reference charge packet Qdac. Thus, an ones density data stream containing 66.7% ones and 33.3% zeroes is generated. After completing a conversion of the input voltage value, the ones density data stream can be processed by the subsequent digital processing circuitry to determine the digital value thereof.

Specifically, referring to FIG. 2, the ones density data stream is coupled to block 236 for counting the number of occurrences of ones over the conversion cycle. Then the count value, which indicates a temperature measurement in degree Kelvin, is converted to a temperature output value in Centigrade by subtracting a value of 273 in block 238. The temperature output value T(out) can then be provided as a digital output in a serial format by block 240. As described above, gain and offset trims can be applied to correct for offset errors and to improve the accuracy of the temperature output value.

Operation Theory

The operation of the temperature measurement system can be described mathematically by the equations below:

$$\Delta V_{be1} = V_{beh1} - V_{bel1};$$

$$\Delta V_{be2} = V_{beh2} - V_{bel2};$$

$$I_{in} = \frac{Q_{in}}{T} = \frac{\Delta V_{be1} C_{in}}{T}; \text{ and}$$

$$I_{dac} = \frac{Q_{dac}}{T} = \frac{\Delta V_{be2} C_{dac1} + V_{beh2} C_{dac2}}{T},$$

where:

$V_{beh1}$=voltage across input diode D1 at high current level in Volts;

$V_{bel1}$=voltage across input diode D1 at low current level in Volts;

$I_{in}$=ADC input current in Amperes;

$Q_{in}$=charge from input diode D1 applied to ADC at each sample cycle;

T=sample cycle period in seconds;

$C_{in}$=input capacitor value in Farads;

$V_{beh2}$=voltage across reference diode at high current level in Volts;

$V_{bel2}$=voltage across reference diode at low current level in Volts;

$I_{dac}$=full-scale DAC current in Amperes;

$Q_{dac}$=total charge from reference diode at each sample cycle;

$C_{dac1}$=ADC reference capacitor Cdac1 in Farads; and $C_{dac2}$=ADC reference capacitor Cdac2 in Farads.

The ones density at the system digitized output (digital_out) $D_{out}$ is given by:

$$D_{out} = \frac{I_{in}}{I_{dac}} = \frac{\Delta V_{be1} C_{in}}{(\Delta V_{be2} C_{dac1} + V_{beh2} C_{dac2})}.$$

If the ratio of the capacitors is defined using constants k and m such that:

$$C_{in} = k C_{dac2} \text{ and } C_{dac1} = m C_{dac2},$$

and if $\Delta V_{be1}$ is assumed equal to $\Delta V_{be2}$ (because the same currents are time shared through both isothermal diodes and Ia=Ic), then $$D_{out} = \frac{I_{in}}{I_{dac}} = \frac{k \Delta V_{be} C_{dac2}}{(m \Delta V_{be} C_{dac2} + V_{beh} C_{dac2})} = \frac{k \Delta V_{be}}{(m \Delta V_{be} + V_{beh})}.$$

The variables $\Delta V_{be}$ and $V_{beh}$ are actually functions of the ambient temperature $T_{amb}$, with derivatives of inverse sign (refer to U.S. Pat. No. 6,183,131 for a detailed description). Because $\Delta V_{be}$ and $V_{beh}$ are functions of $T_{amb}$, the relationship for $D_{out}$ can be explicitly defined as a function of temperature by:

$$D_{out}(T_{amb}) = \frac{k \Delta V_{be}(T_{amb})}{(m \Delta V_{be}(T_{amb}) + V_{beh}(T_{amb}))}.$$

The final output of the system is a digital number, $T_{out}$, to be interpreted as temperature in the Centigrade (also called Celsius) system. The digital post processing circuit computes the output number, $T_{out}$, from the ones density by:

$$T_{out}(T_{amb}) = T_{FS} D_{out}(T_{amb}) - T_{offset},$$

where:

$T_{FS}$ = a programmable full-scale temperature gain coefficient;

$T_{offset}$ = a programmable offset set to the sum of required offsets such that:

$$T_{offset} = 273.15 + T_{hyp} + T_{dev},$$

where:

$T_{hyp}$ = hyperbolic offset correction "k" from equation 20 in U.S. Pat. No. 6,183,131;

$T_{dev}$ = device imperfection offset, which varies from system to system.

A bandgap voltage reference can be designed to exhibit a temperature coefficient that is exactly zero at one target temperature and to exhibit a minimal, but non-zero, temperature coefficient over a useful range of temperatures. The constant m would be picked to exactly cancel the derivative of $V_{beh}$ at one target temperature if the temperature coefficient characteristics of a bandgap voltage based reference circuit were to be reproduced.

In the present temperature measurement system, the constant m can be intentionally chosen to be larger than the value would be for zero temperature coefficient operation. The constants k and m are instead set to that choice of capacitor ratios required to implement the desired amount of hyperbolic linearization. Refer to U.S. Pat. No. 6,183,131 for a detailed description on hyperbolic linearization.

Note that the field of this invention is not limited to choices of k and m that exactly correspond to those outlined in U.S. Pat. No. 6,183,131. A reasonable range of these parameters may be acceptable or useful, including the case where m is chosen for zero temperature coefficient at one target temperature as above.

Alternate Embodiments

In the present embodiment, the temperature measurement system accumulates charge on the falling edge of input voltage step Vin and on the rising edge of the reference charge packet. However, this implementation scheme is illustrative only and one of ordinary skill in the art would appreciate that the temperature measurement system of the present invention can be operated using other clocking schemes. For instance, the temperature measurement system can be made to accumulate charge on the rising edge of input voltage step Vin and on the falling edge of the reference charge packet. In that case, because the modulator uses an inverting amplifier, the integ_out signal needs to be inverted by an inverting buffer before being compared with the reference voltage $V_{Ref}$. For example, an inverting buffer having a gain of –K can be interposed between capacitor Caccum and comparator 120.

In an alternate embodiment of the temperature measurement system of FIG. 1, the magnitude of the current switched to generate voltage step Vdac2 is reduced and the capacitance value of capacitor Cdac1 is adjusted so that the same net charge flows from the charge packet generator at Qdac.

The net reference charge Qdac generated by the reference charge packet generator was shown above to be given by:

$$Q_{dac} = C_{dac1} \Delta V_{BE2} + C_{dac2} V_{BEH2} = C_{dac2}(V_{BEH2} + m \Delta V_{BE2}),$$

where capacitor Cdac1 is m times capacitor Cdac2. It can be seen by inspection that:

$$V_{BEH2} = V_{BEL2} + \Delta V_{BE2}.$$

Thus, an equivalent charge Qdac can be given as:

$$Q_{dac} = C_{dac2}(V_{BEL2} + (m+1) \Delta V_{BE2}).$$

According to the above equation, the amplitude of the switched current for generating voltage step Vdac2 can be chosen to be equal in magnitude to the smaller current value Ic and a voltage step of amplitude $V_{BEL}$, not $V_{BEH}$, can be produced at node 109 if the ratio of capacitors Cdac1 to Cdac2 is increased from m times larger to m+1 times larger. The two-diode larger capacitor Cdac1 embodiment described here and shown in FIG. 4 will exhibit linearity error correcting hyperbolic linearization identical to the system of FIG. 1 described above. The Operation Theory above will apply to the present embodiment if the expression for reference charge packet Qdac derived here is substituted. Moreover, the timing diagram of FIG. 3 applies to the present embodiment if the magnitude of voltage Vdac2 is adjusted from a peak value of $V_{BEH}$ to a lower value $V_{BEL}$.

Figure 4:
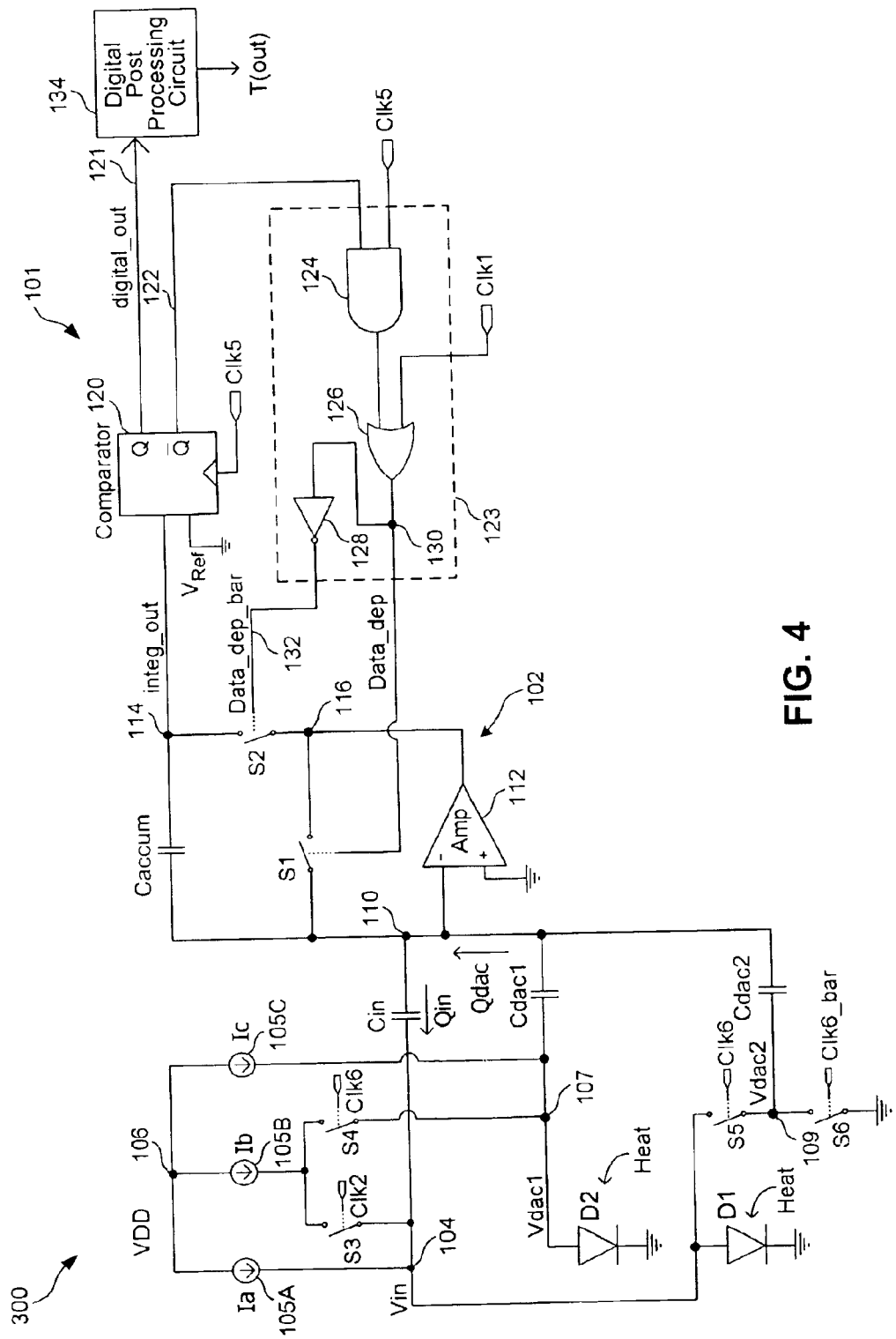
FIG. 4 is a schematic diagram of a digitizing temperature measurement system according to another alternate embodiment of the present invention employing two diodes and a capacitor Cdac1 that is (m+1) times capacitor Cdac2.

The larger capacitor Cdac1 embodiment for a 2-diode system can be implemented by modifying the temperature measurement systems of FIG. 1 to the embodiment shown in FIG. 4 as follows. The reference charge packet generator can be modified so that switch S5 is disconnected from voltage Vdac1 at node 107 and is coupled from voltage Vdac2 at node 109 to voltage Vin at node 104. FIG. 4 illustrates a temperature measurement system 300 implementing the larger capacitor Cdac1 embodiment in the 2-diode configuration. Like elements in FIGS. 1 and 4 are given like reference numerals and will not be further described.

In temperature measurement system 300, diode D1 is coupled to generate the input voltage step Vin and the voltage step Vdac2. By the operation of clocks CLK2 and CLK6 under the timing scheme of FIG. 3, voltage Vdac2 reaches a $V_{BEL}$ voltage when switch S5 is closed by the switched excitation of current Ia. Diode D2 on the other hand is used only for generating voltage step Vdac1 which is the $\Delta V_{BE2}$ voltage by the switched excitation of currents Ic and Ib+Ic. Capacitor Cdac1 is made (m+1) times larger than capacitor Cdac2 so that the same system level operation described above with reference to FIG. 1 applies to temperature measurement system 300.

In the above descriptions, the temperature measurement system of the present invention is configured in a two-diode configuration. In the two-diode configuration, one of the component charge packets within reference charge packet generator 108 is coupled to the input of the ADC circuit through a switched capacitor. In an alternate embodiment, a three-diode configuration may be used so that all of the input signals to the ADC circuit, that is, the input signal Vin and both of the component charge packets, are truly AC coupled to the ADC circuit. That is, all three inputs are applied without the use of any held-charge switched capacitor operating techniques.

Figure 5:
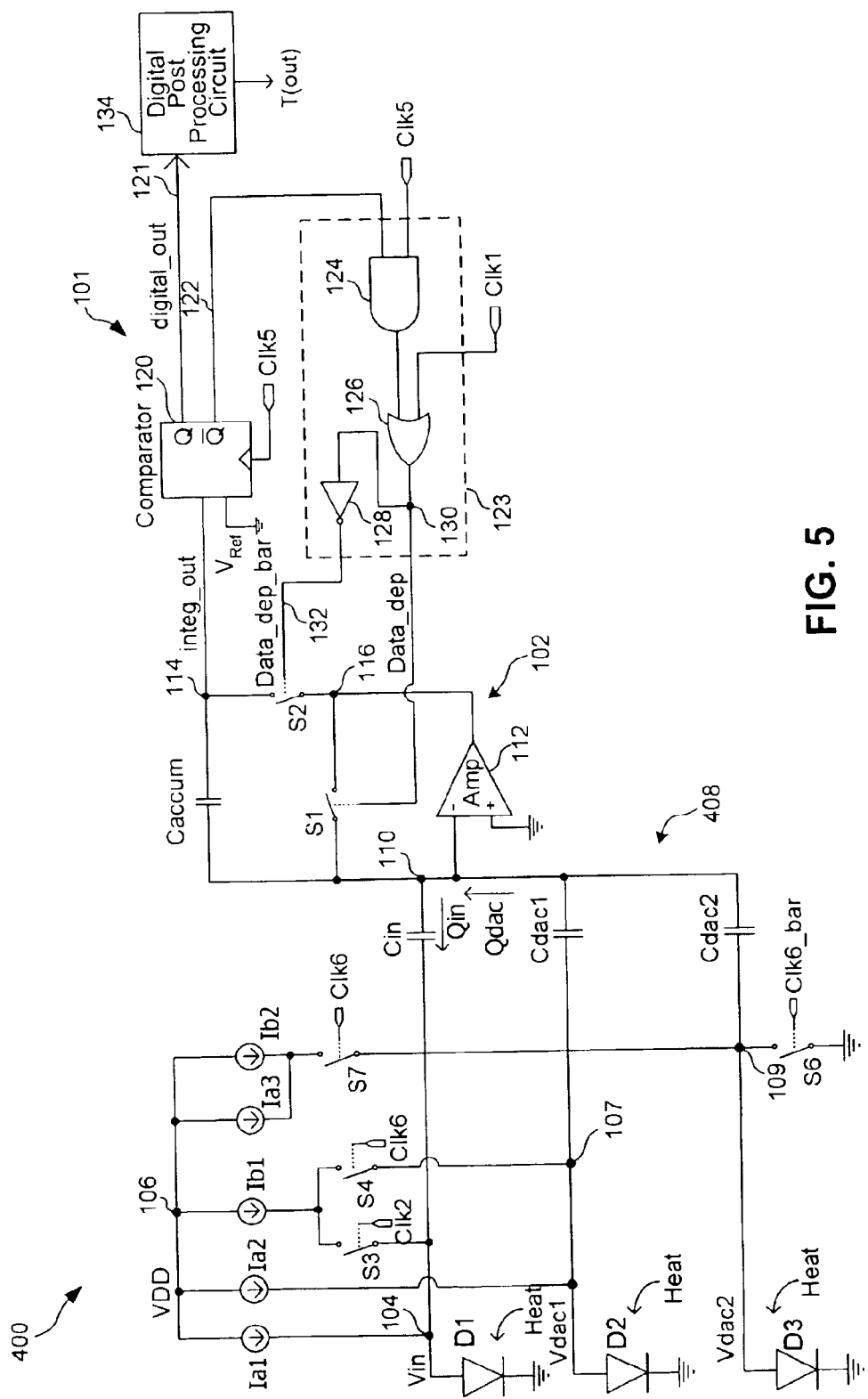
FIG. 5 is a schematic diagram of a digitizing temperature measurement system according to an alternate embodiment of the present invention.

FIG. 5 is a schematic diagram of a digitizing temperature measurement system according to an alternate embodiment of the present invention where a three-diode configuration is used to sample the ambient temperature and to generate the reference signals for the ADC circuit. Temperature measurement system 400 of FIG. 5 is implemented in a similar manner as temperature measurement system 100 of FIG. 1 except for the configuration of the excitation source and the use of three diodes for input and reference signals generation. Like elements in FIGS. 1 and 5 are given like reference numerals to simplify the discussion.

In the three-diode configuration of FIG. 5, temperature sensing diodes D1, D2 and D3 are included in system 400 and are placed in close proximity to each other so that each senses the same ambient temperature. Diodes D1 and D2 are configured in the same manner as in temperature measurement system 100 and receive switched current excitation from current sources Ia1, Ia2 and Ib1 coupled through switched S3 and S4. Specifically, diode D1 is excited by current Ia1 and current Ia1+Ib1 while diode D2 is excited by current Ia2 and current Ia2+Ib1, where current Ia1=current Ia2. Thus, input voltage step vin and reference voltage step Vdac1 are generated in the same manner as previously described with respect to temperature measurement system 100.

Unlike system 100 of FIG. 1, reference voltage step Vdac2 at node 109 of system 400 of FIG. 5 is generated by diode D3 through the switched excitation of current sources Ia3 and Ib2 and no held-charge switched capacitor operation is involved. Referring to FIG. 5, the generation of the equivalent voltage step Vdac2 (that is, the $V_{BEH3}$ voltage) is accomplished by using a switch S7 and two current sources Ia3 and Ib2 to generate voltage Vdac2 across the third isothermal diode D3. The capacitor Cdac2 is now continuously connected to diode D3 and the continuous time voltage waveform at node 109 of diode D3 is AC coupled through capacitor Cdac2 to the amplifier input terminal (node 110). Switch S7 and switch S6 are controlled by complementary clock signals Clk6 and Clk6_bar, respectively, so that when one switch is closed, the other is open. Thus, when switch S6 is closed, voltage Vdac2 is pulled to the ground potential. When switch S7 is closed, an excitation current of Ia3+Ib2 is coupled to excite diode D3 to generate a $V_{BEH3}$ voltage. As a result, voltage Vdac2 switches from zero Volts to a $V_{BEH3}$ voltage and can be truly AC coupled by an unswitched capacitor Cdac2 directly from diode D3 to the inverting input terminal (node 110) of amplifier 112. Unlike the switched capacitor operation of switches S5 and S6 of system 100 of FIG. 1, the timing of the control signals Clk6 and Clk6_bar are not required to be designed to be non-overlapping, as the continuous time integration at capacitor Caccum allows recovery from any glitching due to overlapped switch control signals. In the present embodiment, Ia3=Ia2 and Ib2=Ib1 so that diode D2 and diode D3 are excited by the same amount of switched currents.

When current Ia3+Ib2 through diode D3 is equal to the current Ia2+Ib1 through diode D2 and diode D3 is assumed well matched to diode D2, then voltage $V_{BEH3}$ at node 109 in system 400 of FIG. 5 is equal to voltage $V_{BEH2}$ at node 109 in system 100 of FIG. 1, and the temperature measurement system 400 can be operated as shown in the timing diagram of FIG. 3 to sample and digitize temperature measurements in the same manner as described above with reference to temperature measurement system 100. Furthermore, if voltage $V_{BEH3}$ of system 400 is equal to voltage $V_{BEH2}$ of system 100, the mathematical description for the two-diode configuration in the Operation Theory section above also applies to the three-diode configuration in FIG. 5. When the three-diode configuration in FIG. 5 is used, true AC coupling of the continuous time voltage change at voltage Vdac2 is realized which removes the source of kT/C noise that a switched capacitor introduces. As a result, the noise of the resulting temperature measurement system is significantly reduced.

In the embodiment shown in FIG. 5, the excitation current switched by switch S7 is shown as being generated by two summed current sources Ia3 and Ib2. A person of ordinary skill in the art would appreciate that a single current source can be used to provide the sum Ia3+Ib2 of the two currents to be switched by switch S7 into diode D3.

Like the two diode embodiment, the three diode system of FIG. 5 can also be adapted to produce an equivalent charge at Qdac by switching a smaller current through diode D3 and using a larger capacitor Cdac1. With respect to 3-diode temperature measurement system 400 of FIG. 5, the reference charge packet generator can be modified so that a current of Ia3, instead of Ia3+Ib2, is switched by switch S7 through to diode D3 to generate voltage step Vdac2. In this embodiment, by making capacitor Cdac1 equal to (m+1) times capacitor Cdac2, the same net charge results and reference charge packet Qdac having the same magnitude as that in FIG. 5 can be produced. This three diode smaller current-larger capacitor Cdac1 embodiment requires less area to implement the current sources and less diode drive current power than the 3-diode configuration of FIG. 5 while requiring possibly more area for capacitor Cdac1.

Exemplary capacitance values for capacitors Cin, Caccum, Cdac1 and Cdac2 that can be used to implement the temperature measurement systems of the present invention are given as follows. In one embodiment, for temperature measurement system 100 and temperature measurement system 400 where voltage Vdac2 is the $V_{BEH}$ voltage of the respective diode, capacitor Cdac2 is 0.2 pF. Capacitor Cdac1 is (m*Cdac2) where m is equal to 9 in one embodiment. Thus, Cdac1=9*Cdac2=1.5 pF. Capacitor Cin is k*Cdac2 where k is selected to be 12 for hyperbolic correction. Thus, capacitor Cin is 2.4 pF. Capacitor Caccum has the same capacitance value as capacitor Cin and is 2.4 pF.

In another embodiment, for temperature measurement system 300 and modified temperature measurement system 400 where voltage Vdac2 is the $V_{BEL}$ voltage of the respective diode, capacitor Cdac2 is 0.2 pF. Capacitor Cdac1 is (m+1)*Cdac2 where m is equal to 9 in one embodiment. Thus, Cdac1=10*Cdac2=2.0 pF. Capacitor Cin is k*Cdac2 where k is selected to be 12 for hyperbolic correction. Thus, capacitor Cin is 2.4 pF. Capacitor Caccum has the same capacitance value as capacitor Cin and is 2.4 pF.

In the above descriptions, amplifier 112 is implemented as an operational amplifier where the non-inverting input terminal is connected to the ground potential. In an alternate embodiment, the amplifier can be implemented as a two terminal self-referential inverting transconductance amplifier (referred to herein as a gmIC). An amplifier capable of operating at very low voltage levels with uncompromised or even improved performances in transconductance is described in commonly assigned U.S. Pat. No. 6,147,550, entitled "Method And Apparatus For Reliably Determining Subthreshold Current Densities In Transconductance Cells," of Peter R. Holloway, issued Nov. 14, 2000; and also in commonly assigned U.S. Pat. No. 5,936,433, entitled "Comparator Including A Transconducting Inverter Biased To Operate In Subthreshold," of Peter R. Holloway, issued Aug. 10, 1999. Both of the aforementioned patents are incorporated herein by reference in their entireties. Thus, in the alternate embodiment, amplifier 112 is implemented based on the transconductance inverting cell technology described in the aforementioned patents and amplifier 112 is self-referencing. Therefore, amplifier 112 includes only one input terminal coupled to node 110 and no reference voltage input terminal is needed.

Furthermore, in another alternate embodiment, comparator 120 can also be implemented as a transconductance amplifier (gmIC) described above. Because a gmIC is a self-referential amplifier, comparator 120 will not require a separate reference voltage $V_{Ref}$. When amplifier 112 or comparator 120 is implemented as a gmIC, the temperature measurement system of the present invention can be operated with a very low noise level even at minimal supply voltage because gmIC amplifiers are designed to run at a constant current density over temperature.

Switches S1 and S2 in modulator 101 are composed of MOS transistors and are typically controlled by non-overlapping digital signals. When any MOS switch is turned from on to off, its stored channel charge will be shared by the capacitors and circuit elements connected to both its analog input and its analog output terminals. This charge sharing condition is often referred to as charge feed-through. This channel charge is an additive error because it does not originate from the input analog signals but is generated from within the switches when they are switched off.

In one embodiment, the switches in modulator 101 can be implemented using any conventional switch circuits. According to an alternate embodiment of the present invention, switches S1 and A2 of modulator 101 are implemented as "boosted" switches to reduce charge feed-through that may occur when the switches are being turned on or off. A self-bootstrapping constant on-resistance switch circuit is described in copending and commonly assigned U.S. patent application Ser. No. 10/402,080, entitled "A Constant RON Switch Circuit with Low Distortion and Reduction of Pedestal Errors," of Peter R. Holloway, filed Mar. 27, 2003, which patent application is incorporated herein by reference in its entirety. When the low distortion boosted switch circuit described in the aforementioned patent application is used to implement switches S1 and S2, errors resulting from channel charge feed-through during the switching of the switches are significantly reduced and excellent measurement accuracy can be realized in the temperature measurement system of the present invention, which accuracy cannot be readily realized in conventional temperature measurement systems.

Furthermore, in another embodiment of the present invention, switch S1 and switch S2 are scaled to ensure that the net charge error accumulated in capacitor Caccum during each sampling cycle is nearly zero. Specifically, because switch S1 and switch S2 are connected to different nodes within the modulator circuit, the feed-through charge error generated by equally-sized switches does not result in a zero net charge error across capacitor Caccum. It is known that the channel charge error generated within a switch is proportional to its gate area. By scaling the ratio of the gate areas of switches S1 and S2 appropriately, the amount of charge error can be applied to both sides of capacitor Caccum, first by one switch and then by the other, which results in a net charge error of nearly zero being held in capacitor Caccum at the end of each sampling cycle.

In one embodiment, the temperature measurement system of the present invention, including the temperature sensing diodes and the digital post processing circuit, is integrated onto a single integrated circuit. In other embodiments, the temperature sensing diodes can be formed on an integrated circuit separate from the temperature measurement system where the excitationcurrents are provided to the diodes through external pins on the temperature measurement system. In yet another embodiment, the digital post processing circuit of the temperature measurement system may be formed on an integrated circuit separate from the temperature measurement system. In general, the temperature measurement system of the present invention can be fabricated using various degree of integration, as is well understood by one skilled in the art.

System Characteristics and Advantages

The temperature measurement system of the present invention provides many advantages over conventional temperature measurement systems. In particular, the unique features and configuration of the temperature measurement system of the present invention allow the system to exhibit very low noise operation and to provide very accurate temperature measurements.

First, the temperature measurement system of the present invention is capable of being operated in a wide range of supply voltages, such as from 1.0 volt to 5.5 Volts. More importantly, the temperature measurement system of the present invention is capable of operating at very low supply voltages, such as from 1.0 Vdc or below. In fact, the temperature measurement system of the present invention only requires the supply voltage to be 0.1 to 0.2 Vdc greater than a forward voltage drop of a diode, that is, the temperature dependent $V_{BE}$ voltage.

The low supply voltage operation of the temperature measurement system of the present invention is realized by the use of a charge domain reference signal in the ADC circuit of the temperature measurement system. The use of a charge domain reference signal is a significant deviation from conventional temperature measurement systems where a voltage-based reference signal derived from a bandgap voltage reference is often used in the ADC circuit. Such bandgap voltage references require the generation of a large voltage which is the sum of voltage components with opposite temperature coefficients. As a result, the minimum supply voltage for the temperature measurement system is often limited by the bandgap voltage circuit.

Specifically, conventional bandgap voltage circuits typically generate bandgap voltages in the range of 1.2 Vdc to 1.25 Vdc. Because the conventional bandgap voltage circuit must provide at least a 1.2 Vdc output voltage, the circuit must be operated on a supply voltage that is greater than its output voltage. That is, the conventional bandgap voltage circuit must be operated at the bandgap voltage plus some voltage "headroom." The amount of voltage headroom required for any given bandgap voltage reference design is topology dependent and is typically in the range of 1.0 Vdc to 1.5 Vdc. Thus, the conventional temperature measurement systems relying on a bandgap reference voltage can be operated at a supply voltage of no less than about 2.2 Vdc.

On the contrary, the temperature measurement system of the present invention does not require the summing of voltage components to make one larger reference voltage nor does it require an amplifier with its accompanying headroom voltage requirements. Therefore, the temperature measurement system of the present invention is not subjected to the minimum supply voltage restriction of the reference voltage plus voltage headroom. By using a charge domain reference signal in the ADC circuit, the only restriction on the supply voltage is that the supply voltage must be 0.1 to 0.2 Vdc greater than a forward voltage drop of a diode, that is, the temperature dependent $V_{BE}$ voltage. The temperature measurement system of the present invention can generate a charge-based reference signal for supply voltages down to about 1.0 Vdc or less. Such low supply voltage operation is not possible in conventional temperature measurement systems.

Another advantage of the charge domain reference is that its implementation is simple and requires minimal area. When a bandgap voltage reference is needed, complex circuitry for generating the bandgap voltage, including a high quality error amplifier, are typically required. The charge domain reference uses the existing integrator amplifier to perform the summation in the charge domain and thus requires one less amplifier than a conventional bandgap voltage reference. The charge domain reference signal is a smaller and simpler circuit thereby requiring less silicon area and thus less cost to implement and less power to operate.

Another advantage in using charge domain reference signal is a significant improvement in accuracy and noise that arises from eliminating entirely the need for using an error amplifier to stabilize the voltage reference in the bandgap voltage circuit. It is well known in the art that there is a magnification of noise and offset voltage errors of any amplifier used to stabilize the operating point of a voltage based bandgap reference. This factor, known as "noise gain," is quite large, typically 10× to 15×, or more. Therefore, by using a charge domain reference signal, the temperature measurement system of the present invention eliminates entirely the need for an error amplifier and therefore the noise and voltage offset errors that would be introduced when such an error amplifier is used.

Second, the temperature measurement system of the present invention uses the same type of passive component (polysilicon capacitors) to sample the input signal and to create and sum the component charge packets. Therefore, a highly accurate ratiometric weighting of the input signal and the reference signals can be done utilizing the well known excellent ratio matching of a unit-based capacitor array. The matching of a unit-based capacitor array exceeds that of any other passive component's ability to ratio match in normal silicon processes.

Third, in one embodiment of the present invention, the temperature measurement system utilizes hyperbolic linearization to greatly increase the accuracy of the temperature measurements. The minor gain and offset errors introduced by the hyperbolic linearization methodology can be readily corrected through trimming. Specifically, in the present embodiment, the temperature measurement system applies one-time digital offset and gain trims which simultaneously remove the gain and offset errors due to circuit imperfections and due to the effects of hyperbolic linearization. Thus, the temperature measurement system is capable of performing very accurate temperature measurements.

Fourth, while the temperature measurement system of the present invention can be operated over a wide supply voltage range, the temperature measurement system also exhibits minimal variation in the output signal due to power supply variation. The excellent power supply rejection ratio (PSRR) obtained is due in part to the use a precision CMOS reference current source described in aforementioned U.S. patent application No. 10/402,447, entitled "A Constant Temperature Coefficient Self-Regulating CMOS Current Source," of Peter R. Holloway et al. Thus, the temperature measurement system of the present invention can provide accurate temperature measurement unimpeded by power supply variations.

Fifth, the temperature measurement system of the present invention utilizes the novel low noise CDS modulator described in aforementioned U.S. patent application No. 10/401,835, entitled "Low Noise Correlated Double Sampling Modulation System," of Peter R. Holloway et al. The modulator operates as a synchronous integrator in the ADC circuit. The use of a charge based reference signal in conjunction with the novel low noise CDS modulator provides further benefits in achieving low noise and high accuracy operations.

In the present embodiment employing a two-diode configuration, voltage Vdac1 from the reference diode D2 is AC coupled through capacitor Cdac1. Because of the non-switched AC coupled connection between the reference diode and the input to the Synchronous Integrator (node 110), charge packets continuously flow back and forth between the reference diode and the integrator input node. With no switch in the circuit path, the dreaded switched capacitor kT/C noise is completely avoided.

Furthermore, the synchronous integrator (modulator 101) implements correlated double sampling at all of the inputs (Vin, Vdac1 and Vdac2 inputs) to the integrator to cancel out offset voltages and 1/f nose. In fact, the amount of CDS low frequency noise cancellation is significant. For instance, the reduction of noise signals in the 5 Hertz range is on the order of 100,000×.

Specifically, when the synchronous integrator is implemented with a gmIC amplifier and with a charge domain reference signal, the following operational benefits can be realized.

First, the use of Correlated Double Sampling (CDS) removes (potentially temperature dependant) amplifier offset voltage error at the input integrator amplifier. CDS also heavily reduces 1/f noise generated within the amplifier.

Second, by eliminating switched capacitors at two of the three summed input signals at the integrator, the kT/C noise sources at those two of three inputs are eliminated.

Third, operation over a wide range of supply voltages, including operation at very low supply voltage levels where all analog signals are well within minimum digital logic DC operating levels, is possible.

Fourth, by implementing an "output steering" topology at the synchronous integrator and the use of minimum channel-charge constant Ron boosted analog switches, analog switch pedestal errors at the integrator output are greatly reduced. The output referred pedestal errors generated by the temperature measurement system of the present invention are in the 3–15 $\mu$Vdc level. This level is about 100×lower than in conventional systems. The low pedestal errors directly translate into minimum amplifier errors, and thus, minimum temperature errors.

Lastly, further reduction of switched capacitor noise can be realized by using the three-diode configuration. In the three-diode configuration, reference charge packets Qdac1 and Qdac2 are generated by separate diodes without the use of switched capacitors. Therefore, all three input signals to the synchronous integrator (the temperature input signal Vin and the reference signals Qdac1 and Qdac2) can be AC coupled through their respective capacitors and are free from switched capacitor kT/C noise.

In summary, the temperature measurement system of the present invention incorporates charge domain reference signals, AC coupling of the input and one or both component charge packets of the reference signals for reduction of switched capacitor noise and novel output steering circuitry to synchronously rectify the AC coupled charge packets, thereby allowing for charge balancing operation with minimal or no alteration of the input topology. Any one or all of the features of the temperature measurement system of the present invention can be applied to allow low supply voltage operation where the minimum supply voltage required is slightly more than the voltage to operate a diode.

The above detailed descriptions are provided to illustrate specific embodiments of the present invention and are not intended to be limiting. Numerous modifications and variations within the scope of the present invention are possible.

The present invention is defined by the appended claims.

We claim:

1. A temperature measurement system comprising:
   a switched excitation circuit coupled to excite a temperature sensing element for generating an input voltage step; and
   an analog-to-digital converter (ADC) circuit coupled to sample said input voltage step and generate a temperature output signal, said ADC circuit comprising:
      a modulator coupled to integrate charge associated with said input voltage step and balance said charge with a charge domain reference signal generated entirely in the charge domain, said modulator generating a digital output signal, said digital output signal forming a digital data stream over a plurality of sampling cycles where said digital data steam has an ones density proportional to the magnitude of said input voltage step; and
      post processing circuit coupled to receive said digital data stream and generating a digital number indicative of the occurrence of ones in said digital data stream within said plurality of sampling cycles as said temperature output signal.

2. The temperature measurement system of claim 1, wherein said charge domain reference signal comprises two component charge packets, said input voltage step and at least one of said two component charge packets of said charge domain reference signal are AC coupled to said modulator of said ADC circuit.

3. The temperature measurement system of claim 1, wherein said post processing circuit comprises:
   a counting circuit receiving said digital data stream and counting occurrences of ones in said digital data stream over a plurality of sampling cycles, said counting circuit generating a count value; and
   an offset subtraction circuit receiving said count value and subtracting from said count value an offset value to generate a temperature output value, wherein said offset value comprises a value for converting said count value from degree Kelvin to degree Centigrade.

4. The temperature measurement system of claim 3, wherein a first trim value is applied to said counting circuit to adjust a total number of sampling cycles for which said occurrences of ones are counted, and a second trim value is applied to said offset subtraction circuit to adjust the value of said offset value.

5. The temperature measurement system of claim 1, wherein said charge domain reference signal comprises a reference charge packet and wherein said modulator applies said reference charge packet to balance said charge associated with said input voltage step based on a data dependent signal, said data dependent signal having a value corresponding to said digital output signal of said modulator.

6. The temperature measurement system of claim 5, wherein said modulator comprises:
   an integer coupled to sample said input voltage step in synchronous with the excitation of said temperature sensing element and to generate an integrator output signal, said integrator comprising:
      an input capacitor having a first terminal coupled to said temperature sensing element and a second terminal;
      an amplifier having a first input terminal coupled to said second terminal of said input capacitor and an output terminal, said input voltage step being AC coupled through said input capacitor to said first input terminal of said amplifier;
      an accumulation capacitor having a first terminal coupled to said first input terminal of said amplifier and a second terminal providing said integrator output signal;
      a first switch coupled between said first input terminal and said output terminal of said amplifier, said first switch being controlled by said data dependent signal; and
      a second switch coupled between said second terminal of said accumulation capacitor and said output terminal of said amplifier, said second switch being controlled by an inverse of said data dependent signal;
   a reference charge packet generator generating said reference charge packet based on a first temperature-dependent voltage step and a second temperature-dependent voltage step, at least one of said first and second temperature-dependent voltage steps being AC coupled to said first input terminal of said amplifier; and
   a comparator having an input terminal coupled to receive a signal corresponding to said integrator output signal and comparing said signal to a reference level, said comparator generating said digital output signal at an output terminal.

7. The temperature measurement system of claim 6, wherein said temperature sensing element comprises a first isothermal diode, and said reference charge packet generator comprises a second isothermal diode, said second isothermal diode being excited by said switched excitation source to generate said first and second temperature-dependent voltage steps.

8. The temperature measurement system of claim 7, wherein said first temperature-dependent voltage step comprises $\Delta V_{BE}$ voltage of said second isothermal diode as a result of the switched excitation of said second isothermal diode by a first current and a second current, and said second temperature-dependent voltage step comprises a $V_{BEH}$ voltage of said second isothermal diode as a result of the excitation of said second isothermal diode by the greater of the first and second currents.

9. The temperature measurement system of claim 7, wherein said reference charge packet generator further comprises:
   a first capacitor having a first terminal coupled to an anode terminal of said second isothermal diode and a second terminal coupled to said first input terminal of said amplifier;
   a third switch coupled between said anode terminal of said second isothermal diode and a first node, said third switch being controlled by a first clock signal;
   a fourth switch coupled between said first node and a ground node, said fourth switch being controlled by an inverse of said first clock signal; and
   a second capacitor having a first terminal coupled to said first node and a second terminal coupled to said first input terminal of said amplifier, said first capacitor being m times larger than said second capacitor;
   wherein said first temperature-dependent voltage step is generated at said anode terminal of said second isothermal diode as a result of the switched excitation of said second isothermal diode by a first current and a second current, and said second temperature-dependent voltage step is generated at said first node as a result of switching said first node from said ground node to said anode terminal of said second isothermal diode by the action of said third and fourth switches during the switched excitation of said second isothermal diode by said second current, said first temperature-dependent voltage step being AC coupled to said first input terminal of said amplifier; and wherein said second current is larger than said first current, said first temperature-dependent voltage step comprises a $\Delta V_{BE}$ voltage of said second isothermal diode and said second temperature-dependent voltage step comprises a $V_{BEH}$ voltage of said second isothermal diode.

10. The temperature measurement system of claim 7, wherein said reference charge packet generator further comprises:

a first capacitor having a first terminal coupled to an anode terminal of said second isothermal diode and a second terminal coupled to said first input terminal of said amplifier;

a third switch coupled between said anode terminal of said first isothermal diode and a first node, said third switch being continued by a first clock signal;

a fourth switch coupled between said first node and a ground node, said fourth switch being controlled by an inverse of said first clock signal; and a second capacitor having a first terminal coupled to said first node and a second terminal coupled to said first input terminal of said amplifier, said first capacitor being (m+1) times larger than said second capacitor;

wherein said first temperature-dependent voltage step is generated at said anode terminal of said second isothermal diode as a result of the switched excitation of said second isothermal diode by a first current and a second current, and said second temperature-dependent voltage step is generated at said first node as a result of switching said first node from said ground node to said anode terminal of said first isothermal diode by the action of said third and fourth switches during the switched excitation of said first isothermal diode by said first current, said first temperature-dependent voltage step being AC coupled to said first input terminal of said amplifier; and wherein said first current is smaller than said second current, said first temperature-dependent voltage step comprises a $\Delta V_{BE}$ voltage of said second isothermal diode and said second temperature-dependent voltage step comprises a $V_{BEL}$ voltage of said first isothermal diode.

11. The temperature measurement system of claim 7, wherein said switched excitation circuit comprises at least one current source, said at least one current source being switchably coupled to excite said first isothermal diode and said second isothermal diode.

12. The temperature measurement system of claim 6, further comprising:

a logic circuit for generating said data dependent signal and said inverse, said logic circuit receiving an input signal corresponding to said digital output signal and a first clack signal, wherein said first clock signal is asserted to cause said data dependent signal to be at a first value for operating said integrator in said correlated double sampling mode.

13. The temperature measurement system of claim 6, wherein said integrator further comprises an inverting buffer having an input terminal coupled to said second terminal of said accumulation capacitor and an output terminal coupled to said input terminal of said comparator, said comparator receiving an input signal being an inverse of said integrator output signal.

14. The temperature measurement system of claim 6, wherein said amplifier comprises a self-referential transconductance amplifier.

15. The temperature measurement system of claim 6, wherein said comparator further comprises a second input terminal coupled to receive a reference voltage as said reference level.

16. The temperature measurement system of claim 6, wherein said comparator comprises a self-referential transconductance amplifier including one or more transconducting inverters.

17. The temperature measurement system of claim 6, wherein each of said first switch and said second switch comprises a self-bootstrapping constant on-resistance switch circuit.

18. The temperature measurement system of claim 6, wherein said integrator integrates charges associated with a rising edge of said input voltage step, and said data dependent signal directing said integrator to either integrate said reference charge packet associated with the falling edges of said first and second temperature-dependent voltage steps or disregard said reference charge packet.

19. The temperature measurement system of claim 6, wherein said reference charge packet is generated based on at least one temperature-dependent voltage step, said integrator integrates charges associated with a falling edge of said input voltage step, and said data dependent signal directing said integrator to either integrate said reference charge packet associated with the rising edges of said first and second temperature-dependent voltage steps or disregard said reference charge packet.

20. The temperature measurement system of claim 6, wherein said first switch is closed and said second switch is open to operate said integrator in a correlated double sampling mode for enabling said amplifier to store an amplifier error voltage onto said input capacitor.

21. The temperature measurement system of claim 20, wherein said amplifier error voltage comprises an amplifier offset voltage, 1/f noise and wideband amplifier noise.

22. The temperature measurement system of claim 6, wherein said temperature sensing element comprises a first isothermal diode, and said reference charge packet generator comprises a second isothermal diode being excited to generate said first temperature-dependent voltage step and a third isothermal diode being excited to generate said second temperature-dependent voltage step.

23. The temperature measurement system of claim 22, wherein said first temperature-dependent voltage step comprises a $\Delta V_{BE}$ voltage of said second isothermal diode as a result of the switched excitation of said second isothermal diode by a first current and a second current, and said second temperature-dependent voltage step comprises a $V_{BEH}$ voltage of said third isothermal diode as a result of the excitation of said third isothermal diode of the greater of the first and second currents.

24. The temperature measurement system of claim 22, wherein said reference charge packet generator further comprises:

a first capacitor having a first terminal coupled to an anode terminal of said second isothermal diode and a second terminal coupled to said first input terminal of said amplifier, said second isothermal diode being excited by a first current and a second current;

a third switch coupled between a third current source and an anode terminal of said third isothermal diode, said third switch being controlled by a fist clock signal, said third current source providing a third current having the same magnitude as said second current to said third isothermal diode;

a fourth switch coupled between said anode terminal of said third isothermal diode and a ground node, said fourth switch being controlled by an inverse of said first clock signal; and a second capacitor having a first terminal coupled to said anode terminal of said third isothermal diode and a second terminal coupled to said first input terminal of said amplifier;

wherein said first temperature-dependent voltage step is generated at said anode terminal of said second isothermal diode and said second temperature dependent voltage step is generated at said anode terminal of said third isothermal diode, said first and second temperature-dependent voltage steps being AC coupled to said first input terminal of said amplifier.

25. The temperature measurement system of claim 24, wherein said first temperature-dependent voltage step comprises a $\Delta V_{BE}$ voltage of said second isothermal diode as a result of the switched excitation of said second isothermal diode by said first current and said second current, and said second temperature-dependent voltage step comprises a $V_{BEH}$ voltage of said third isothermal diode as a result of the excitation of said third isothermal diode by said third current, said third current being larger than said first current, and wherein said first capacitor is m times larger than said second capacitor.

26. The temperature measurement system of claim 24, wherein said first temperature-dependent voltage step comprises a $\Delta V_{BE}$ voltage of said second isothermal diode as a result of the switched excitation of said second isothermal diode by said first current and said second current, and said second temperature-dependent voltage step comprises a $V_{BEL}$ voltage of said third isothermal diode as a result of the excitation of said third isothermal diode by said third current, said third current being smaller than said first current, and wherein said first capacitor is (m+1) times larger than said second capacitor.

* * * * *